(12) United States Patent
Kawashima et al.

(10) Patent No.: US 11,048,134 B2
(45) Date of Patent: Jun. 29, 2021

(54) DISPLAY DEVICE AND ELECTRONIC DEVICE

(71) Applicant: SEMICONDUCTOR ENERGY LABORATORY CO., LTD., Atsugi (JP)

(72) Inventors: Susumu Kawashima, Kanagawa (JP); Naoto Kusumoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/769,333

(22) PCT Filed: Dec. 14, 2018

(86) PCT No.: PCT/IB2018/060075
§ 371 (c)(1),
(2) Date: Jun. 3, 2020

(87) PCT Pub. No.: WO2019/123163
PCT Pub. Date: Jun. 27, 2019

(65) Prior Publication Data
US 2020/0326570 A1  Oct. 15, 2020

(30) Foreign Application Priority Data
Dec. 21, 2017  (JP) .............................. JP2017-245367

(51) Int. Cl.
*G02F 1/1368* (2006.01)
*G02F 1/1333* (2006.01)
(Continued)

(52) U.S. Cl.
CPC ........ *G02F 1/1368* (2013.01); *G02F 1/13338* (2013.01); *G02F 1/136213* (2013.01);
(Continued)

(58) Field of Classification Search
CPC .................................................... G02F 1/1368
See application file for complete search history.

(56) References Cited

U.S. PATENT DOCUMENTS 8,860,108 B2   10/2014  Yamazaki et al.
8,884,852 B2   11/2014  Yamamoto et al.
(Continued)

FOREIGN PATENT DOCUMENTS

CN   101887689 A   11/2010
JP   05-080354 A    4/1993
(Continued)

OTHER PUBLICATIONS

International Search Report (Application No. PCT/IB2018/060075) dated Mar. 12, 2019.
(Continued)

*Primary Examiner* — Sang V Nguyen
(74) *Attorney, Agent, or Firm* — Nixon Peabody LLP; Jeffrey L. Costellia

(57) ABSTRACT

A display device capable of improving image quality is provided. The display device includes a plurality of capacitors, a plurality of transistors, and a display element in a pixel. The plurality of capacitors are connected in series through a wiring, and one of the plurality of transistors is electrically connected to one electrode of the plurality of capacitors connected in series, the other electrode thereof, and the wiring. The display element can operate in accordance with the sum of a plurality of pieces of input data, so
(Continued)

that image correction such as image upconversion, HDR display, or improvement in the luminance can be performed.

14 Claims, 26 Drawing Sheets

(51) Int. Cl.
  *G02F 1/1362* (2006.01)
  *H01L 27/15* (2006.01)
  *H01L 27/32* (2006.01)
(52) U.S. Cl.
  CPC ...... *G02F 1/136286* (2013.01); *H01L 27/156* (2013.01); *H01L 27/3265* (2013.01); *H01L 27/3276* (2013.01)

(56) References Cited

U.S. PATENT DOCUMENTS

| | | | |
|---|---|---|---|
| 10,140,940 | B2 | 11/2018 | Aoki |
| 10,354,574 | B2 | 7/2019 | Kobayashi et al. |
| 2010/0289830 | A1 | 11/2010 | Yamamoto et al. |
| 2017/0092177 | A1* | 3/2017 | Kobayashi ............ G06F 1/1637 |

FOREIGN PATENT DOCUMENTS

| | | | |
|---|---|---|---|
| JP | 2010-266494 A | 11/2010 | |
| JP | 2011-119674 A | 6/2011 | |
| JP | 2011-145447 A | 7/2011 | |
| JP | 2012-145655 A | 8/2012 | |
| JP | 2012145655 * | 8/2012 | .............. G09G 3/22 |
| JP | 2017-027012 A | 2/2017 | |
| JP | 2017-062474 A | 3/2017 | |
| KR | 2010-0122443 A | 11/2010 | |
| KR | 2016-0017959 A | 2/2016 | |
| WO | WO-2017/051288 | 3/2017 | |
| WO | WO-2019/092549 | 5/2019 | |
| WO | WO-2019/123088 | 6/2019 | |
| WO | WO-2019/123130 | 6/2019 | |

OTHER PUBLICATIONS

Written Opinion (Application No. PCT/IB2018/060075) dated Mar. 12, 2019.
Yamazaki.S et al., "Research, Development, and Application of Crystalline Oxide Semiconductor", SID Digest '12: SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics" Jpn. J. Appl. Phys. (Japanese Journal of Applied Physics), Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor arid Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics), 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology: Digest of Technical Papers, 2015, pp. T216-T217.
Amano.S et al., "Low Power LC Display Using In—Ga—Zn-Oxide TFTs Based on Variable Frame Frequency", SID Digest '10: SID International Symposium Digest of Technical Papers, May 23, 2010, vol. 41, No. 1, pp. 626-629.

* cited by examiner

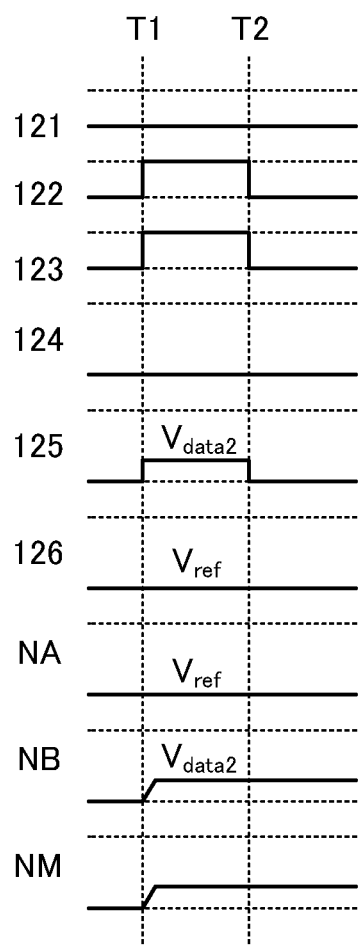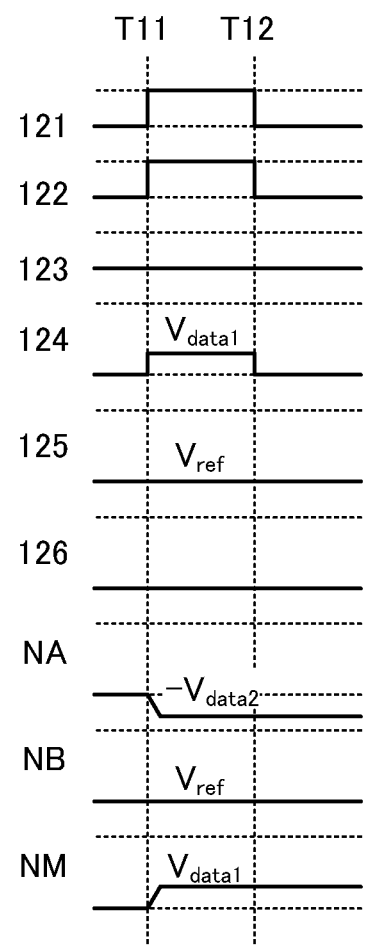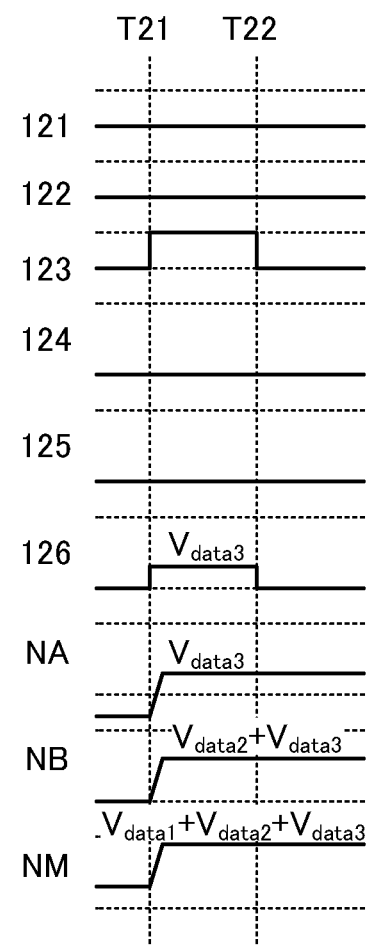

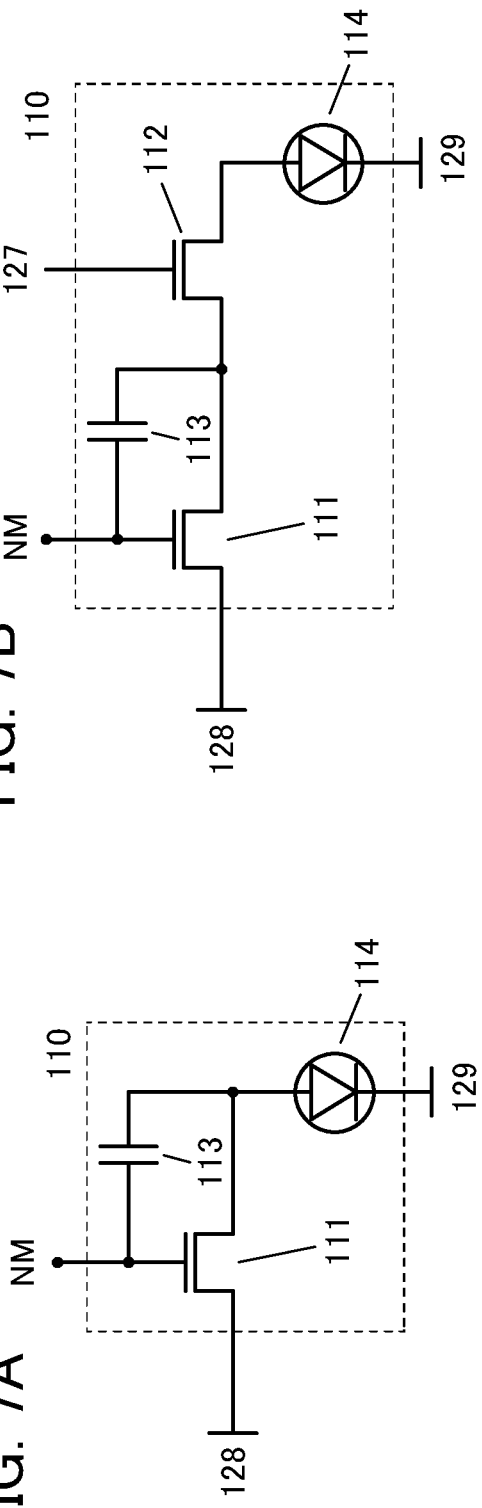
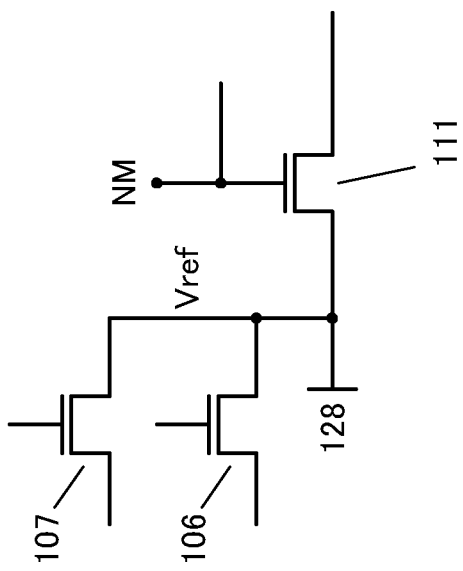
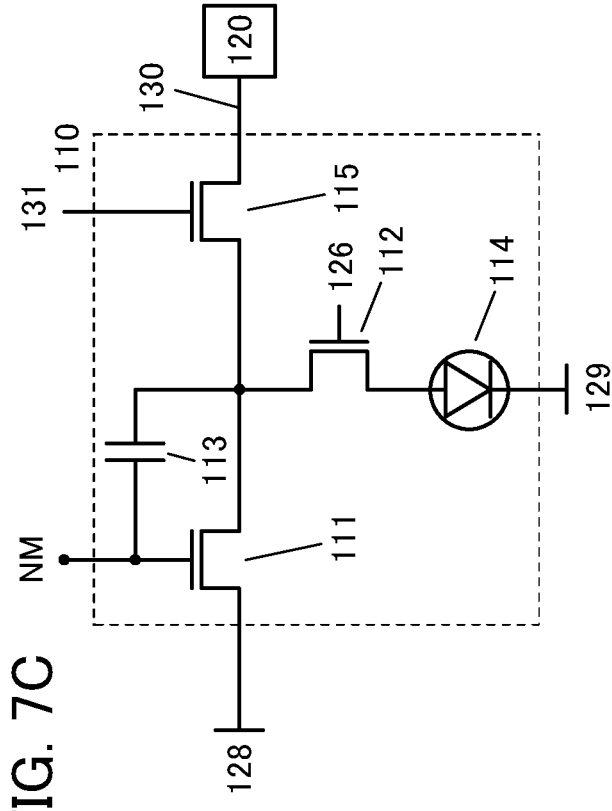
FIG. 7A
FIG. 7B
FIG. 7C
FIG. 7D

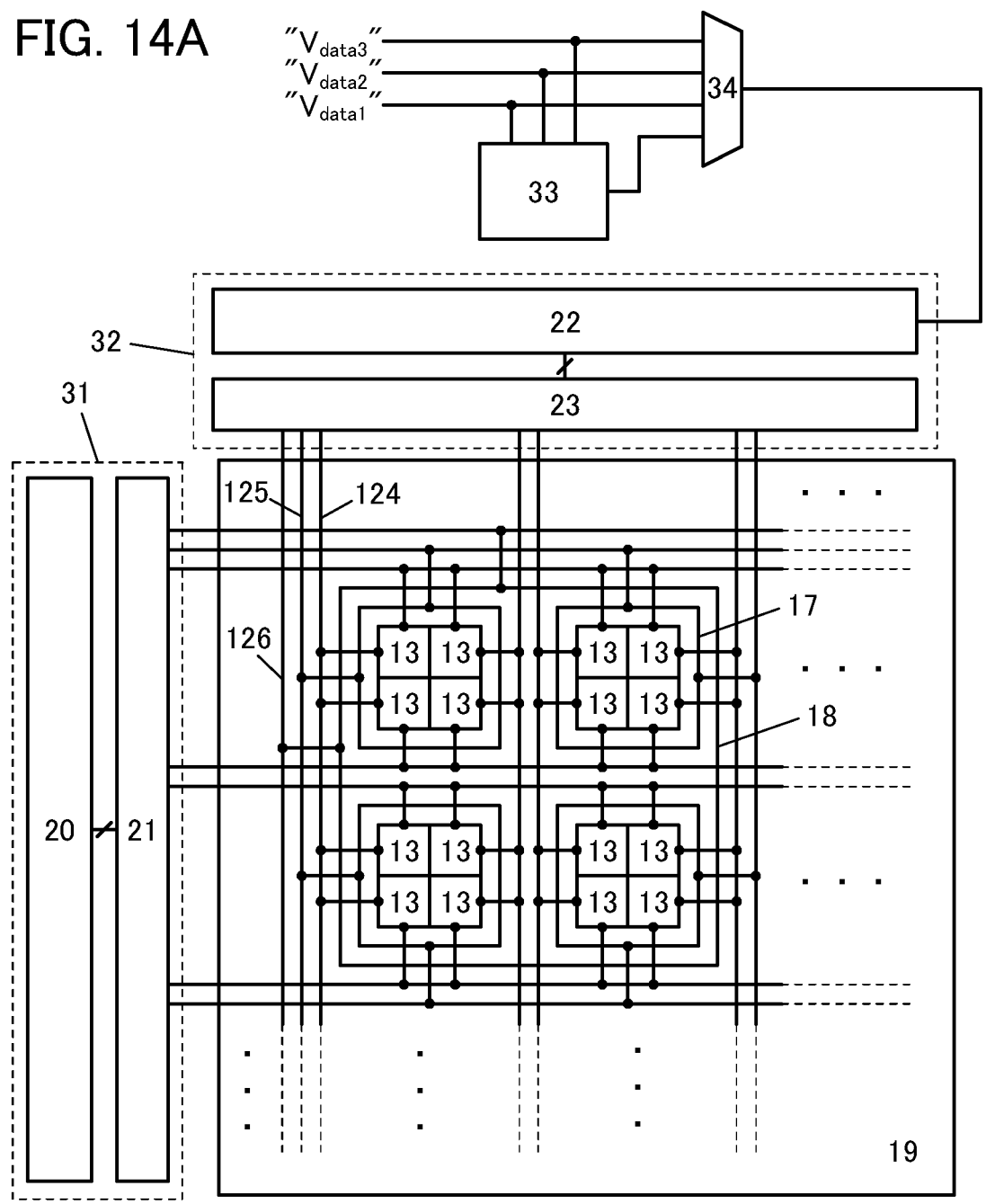
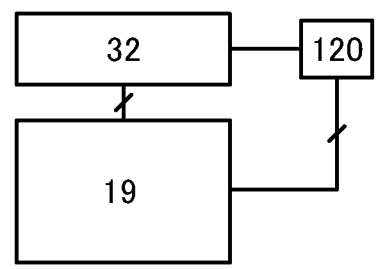
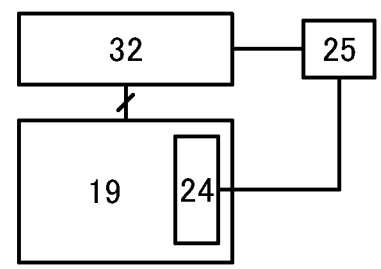

$a = x_1 w_1 + x_2 w_2 + b$

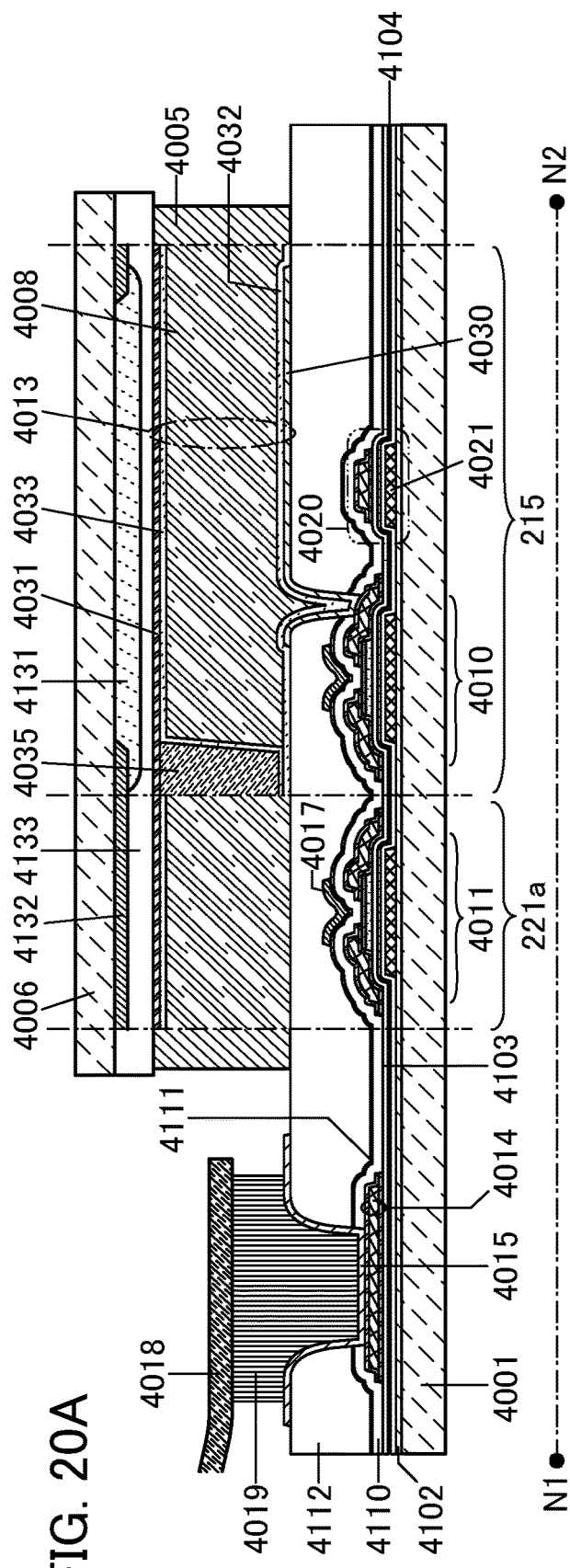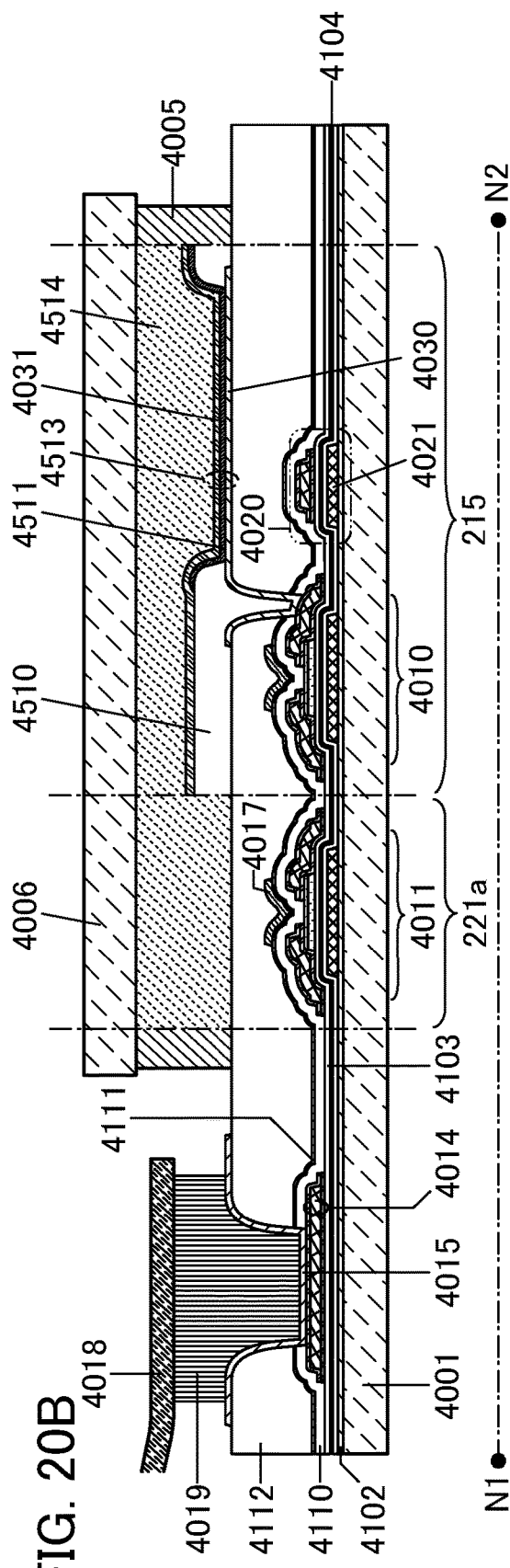

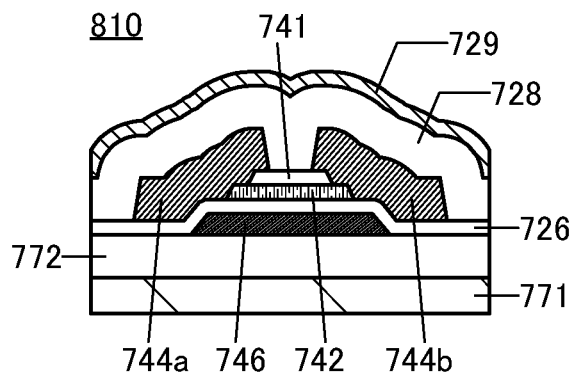
FIG. 22A1
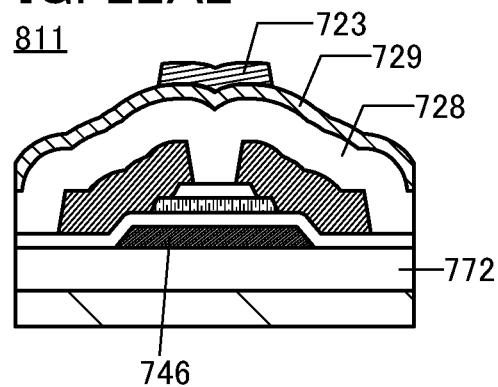
FIG. 22A2
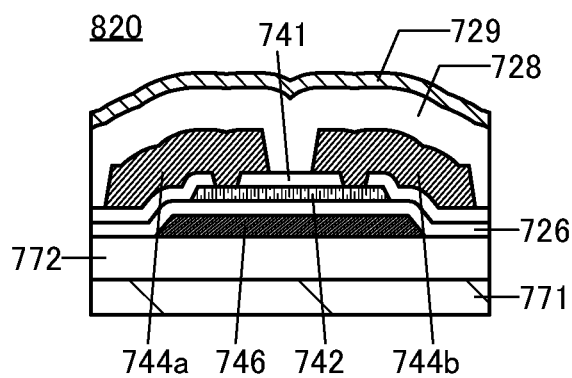
FIG. 22B1
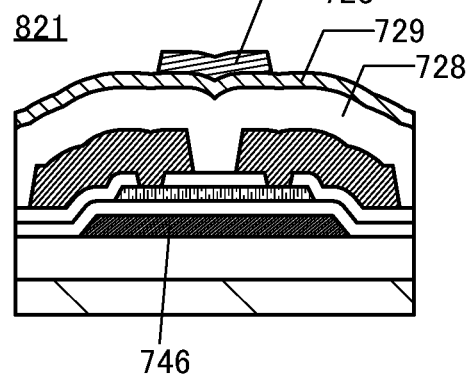
FIG. 22B2
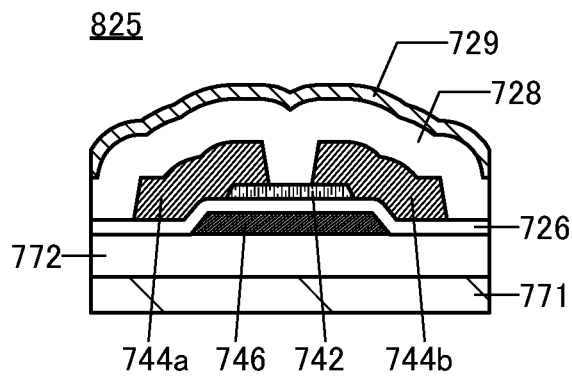
FIG. 22C1
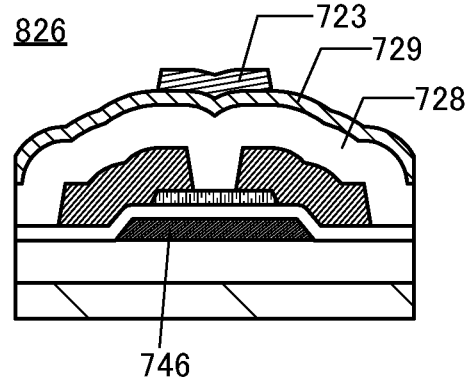
FIG. 22C2

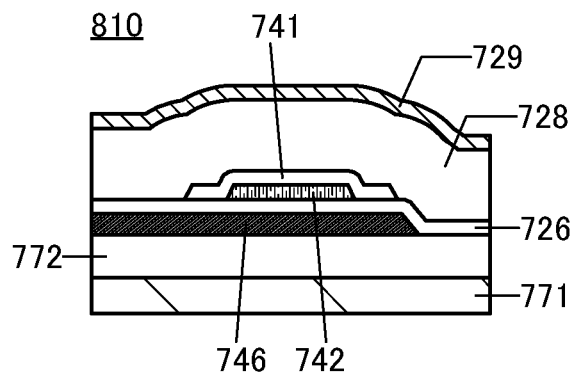
FIG. 23A1
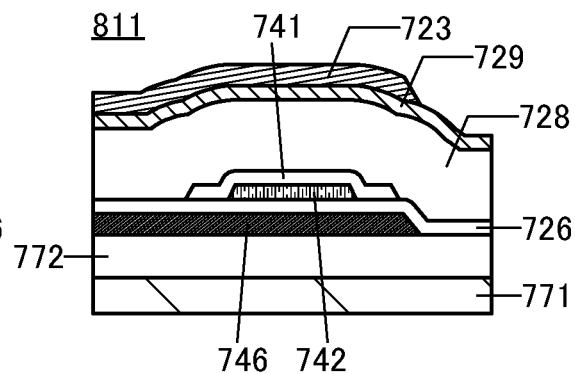
FIG. 23A2
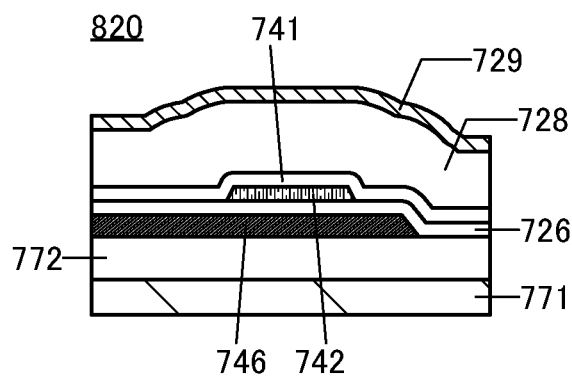
FIG. 23B1
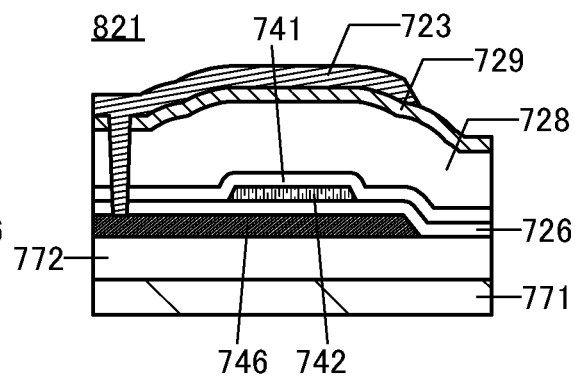
FIG. 23B2
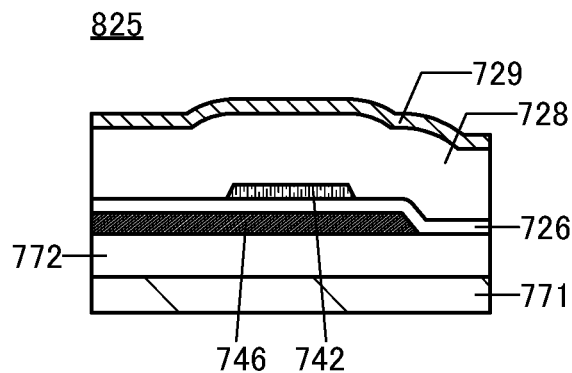
FIG. 23C1
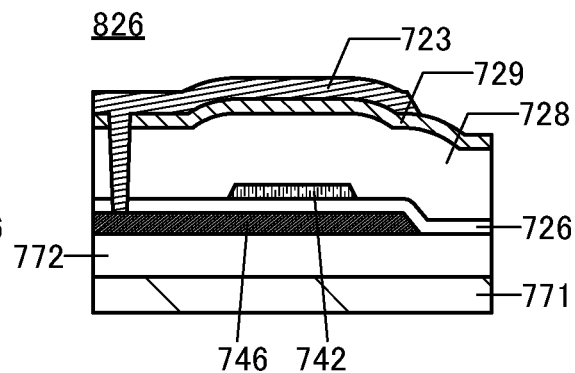
FIG. 23C2

FIG. 24A1
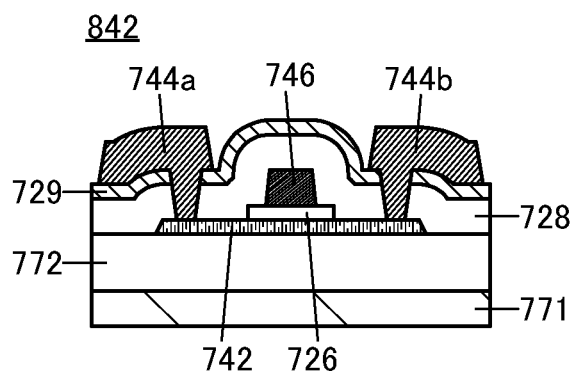
FIG. 24A2
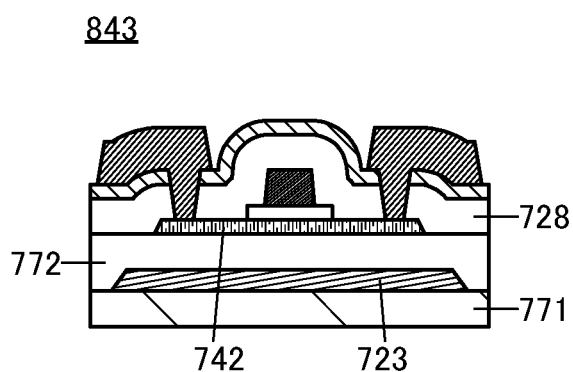
FIG. 24B1
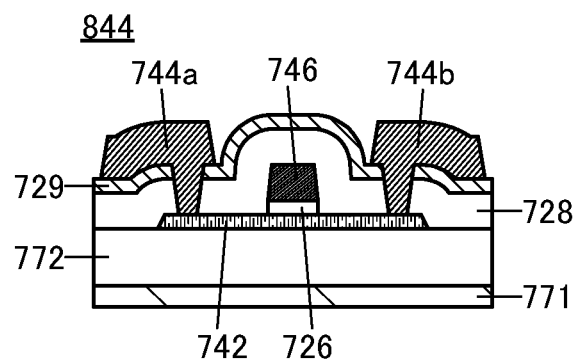
FIG. 24B2
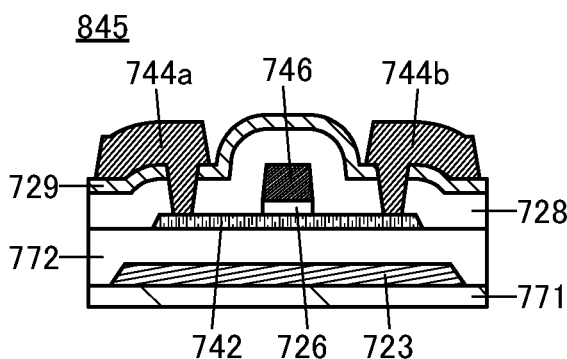
FIG. 24C1
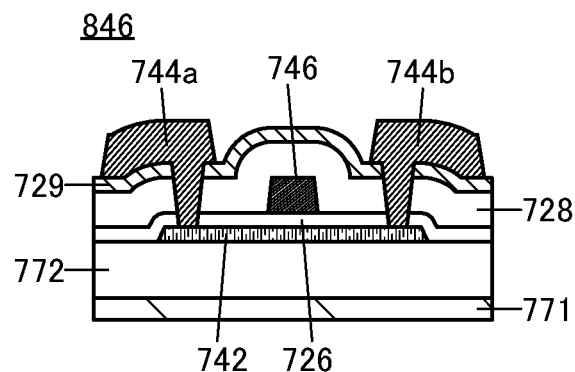
FIG. 24C2
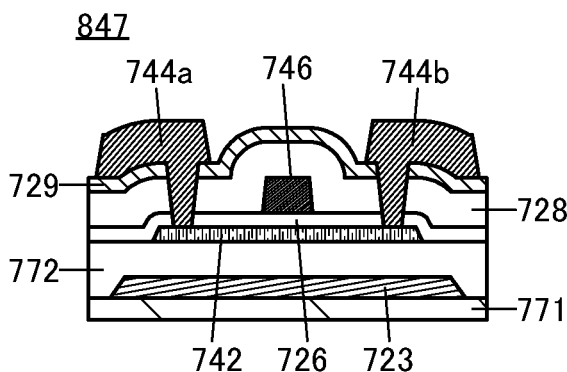

FIG. 25A1
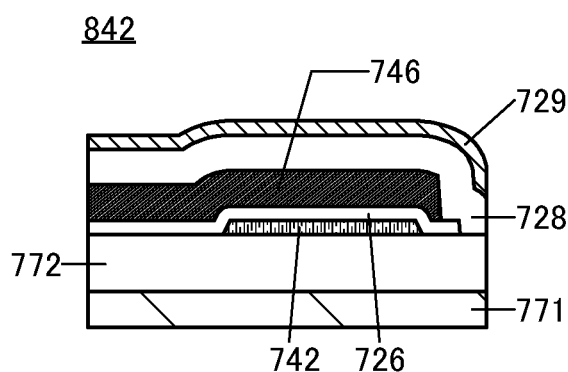
FIG. 25A2
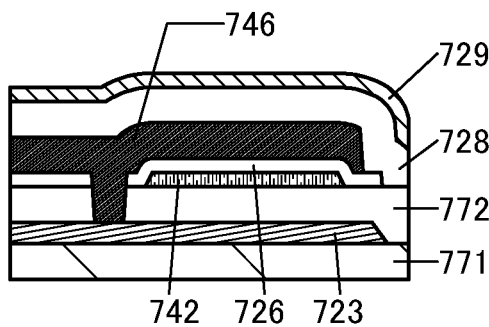
FIG. 25B1
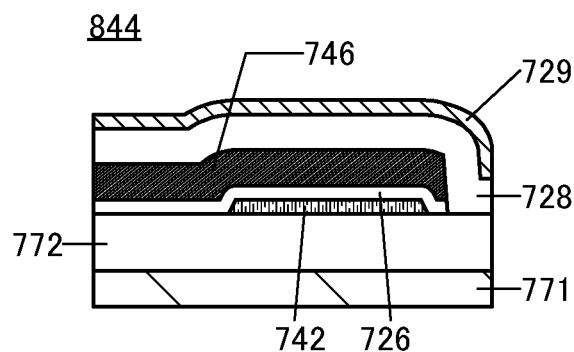
FIG. 25B2
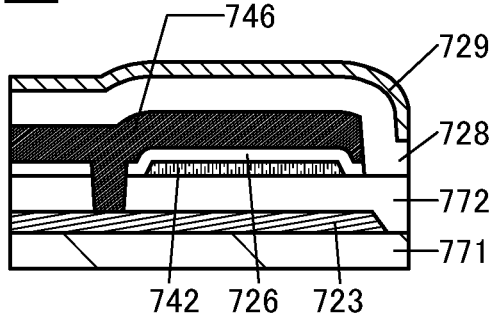
FIG. 25C1
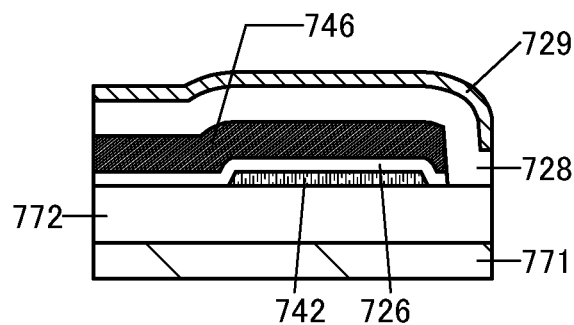
FIG. 25C2
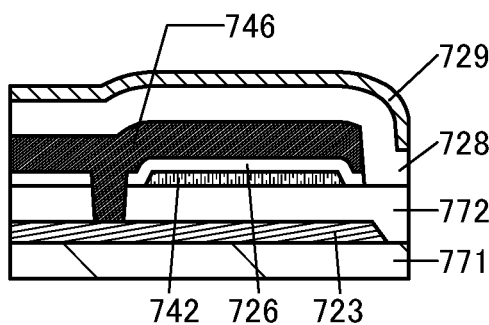

DISPLAY DEVICE AND ELECTRONIC DEVICE

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition (composition of matter). Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A widely known semiconductor thin film that can be used for the transistor is a silicon-based semiconductor material; an oxide semiconductor has attracted attention as another material. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the researches on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). Non-Patent Document 1 and Non-Patent Document 2 also disclose a technique for fabricating a transistor using an oxide semiconductor having a CAAC structure. Moreover, Non-Patent Document 4 and Non-Patent Document 5 show that a fine crystal is included even in an oxide semiconductor which has lower crystallinity than the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

In addition, Patent Document 1 discloses a memory device using a transistor with an extremely low off-state current in a memory cell.

PRIOR ART DOCUMENT

Patent Document

[Patent Document 1] Japanese Published Patent Application No. 2011-19674

Non-Patent Document

[Non-Patent Document 1] S. Yamazaki et al., "SID Symposium Digest of Technical Papers", 2012, volume 43, issue 1, p. 183-186.

[Non-Patent Document 2] S. Yamazaki et al., "Japanese Journal of Applied Physics", 2014, volume 53, Number 4S, p. 04ED18-1-04ED18-10.

[Non-Patent Document 3] S. Ito et al., "The Proceedings of AM-FPD'1.3 Digest of Technical Papers", 2013, p. 151-154.

[Non-Patent Document 4] S. Yamazaki et at, "ECS Journal of Solid State Science and Technology", 2014, volume 3, issue 9, p. Q3012-Q3022.

[Non-Patent Document 5] S. Yamazaki, "ECS Transactions", 2014, volume 64, issue 10, p. 155-164.

[Non-Patent Document 6] K. Kato et at, "Japanese Journal of Applied Physics", 2012, volume 51, p. 021201-1-021201-7.

[Non-Patent Document 7] S. Matsuda et al., "2015 Symposium on VLSI Technology Digest of Technical Papers", 2015, p. T216-T217.

[Non-Patent Document 8] S. Amano et al., "SID Symposium Digest of Technical Papers", 2010, volume 41, issue 1, p. 626-629.

SUMMARY OF THE INVENTION

Problems to be Solved by the Invention

The resolution of display devices has been increased; hardware capable of displaying images of an 8K4K (the number of pixels: 7680×4320) or higher resolution has been developed. In addition, the HDR (high dynamic range) display technique, which increases image quality by luminance adjustment, has been introduced.

In addition, for proper display by a display device, it is necessary to adjust image data with the resolution of the display device. In the case where the display device has an 8K4K resolution and the image data is for a 4K2K (the number of pixels: 3840×2160) resolution, for example, the number of data should be converted by a fourfold increase to perform full-screen display. In contrast, in the case where the display device has the 4K2K resolution and the image data is for the 8K4K resolution, the number of data should be converted into a quarter.

In HDR processing, a dedicated circuit is necessary for generation of image data or conversion of the number of data, which causes a problem of higher power consumption. It is preferable that at least original image data be input to pixels in the display device without conversion.

Thus, an object of one embodiment of the present invention is to provide a display device capable of improving image quality. Another object of one embodiment of the present invention is to provide a display device capable of performing proper display without image data conversion. Another object is to provide a display device capable of performing HDR display. Another object is to provide a display device capable of performing an upconversion operation. Another object is to provide a display device capable of improving the luminance of a displayed image. Another object is to provide a display device capable of displaying two or more images superimposed on each other. Another object is to provide a display device in which a voltage higher than the output voltage of a driver circuit can be applied to a pixel circuit.

Another object is to provide a display device with low power consumption. Another object is to provide a highly reliable display device. Another object is to provide a novel display device or the like. Another object is to provide a method for driving any of the display devices. Another object is to provide a novel semiconductor device or the like.

Note that the descriptions of these objects do not disturb the existence of other objects. One embodiment of the present invention does not have to achieve all the objects. Other objects will be apparent from and can be derived from the descriptions of the specification, the drawings, the claims, and the like.

Means for Solving the Problems

One embodiment of the present invention relates to a display device capable of improving image quality. Alternatively, one embodiment of the present invention relates to a display device capable of performing image processing.

One embodiment of the present invention is a display device including a plurality of capacitors, a plurality of transistors, and a display element. The plurality of capacitors are connected in series through a wiring. One of the transistors is electrically connected to one electrode of the plurality of capacitors connected in series. One of the transistors is electrically connected to the other electrode of the plurality of capacitors. The display element is electrically connected to the other electrode of the plurality of capacitors connected in series. One of the transistors is electrically connected to the wiring.

Another embodiment of the present invention is a display device including a first transistor, a second transistor, a third transistor, a first capacitor, a second capacitor, and a circuit block. One of a source and a drain of the first transistor is electrically connected to one electrode of the first capacitor. The one electrode of the first capacitor is electrically connected to the circuit block. The other electrode of the first capacitor is electrically connected to one of a source and a drain of the second transistor. The one of the source and the drain of the second transistor is electrically connected to one electrode of the second capacitor. The other electrode of the second capacitor is electrically connected to one of a source and a drain of the third transistor. The circuit block includes a display element.

The display device may further include a first wiring. The other of the source and the drain of the first transistor may be electrically connected to the first wiring, and the other of the source and the drain of the third transistor may be electrically connected to the first wiring.

The display device may further include a fourth transistor, a fifth transistor, a second wiring, and a third wiring. One of a source and a drain of the fourth transistor may be electrically connected to the one electrode of the second capacitor. One of a source and a drain of the fifth transistor may be electrically connected to the other electrode of the second capacitor. The other of the source and the drain of the second transistor may be electrically connected to the first wiring. A gate of the first transistor may be electrically connected to the second wiring. A gate of the fourth transistor may be electrically connected to the second wiring. A gate of the second transistor may be electrically connected to the third wiring. A gate of the fifth transistor may be electrically connected to the third wiring.

Another embodiment of the present invention is a display device including a first circuit, a second circuit, a second transistor, a third transistor, and a second capacitor. The first circuit and the second circuit each include a first transistor, a first capacitor, and a circuit block. One of a source and a drain of the first transistor is electrically connected to one electrode of the first capacitor. The one electrode of the first capacitor is electrically connected to the circuit block. The other electrode of the first capacitor is electrically connected to one of a source and a drain of the second transistor. The one of the source and the drain of the second transistor is electrically connected to one electrode of the second capacitor. The other electrode of the second capacitor is electrically connected to one of a source and a drain of the third transistor. The circuit block includes a display element.

The display device may further include a first wiring. The other of the source and the drain of the first transistor included in the first circuit may be electrically connected to the first wiring, and the other of the source and the drain of the third transistor may be electrically connected to the first wiring.

The display device may further include a fourth transistor, a fifth transistor, a second wiring, and a third wiring. One of a source and a drain of the fourth transistor may be electrically connected to the one electrode of the second capacitor. One of a source and a drain of the fifth transistor may be electrically connected to the other electrode of the second capacitor. The other of the source and the drain of the second transistor may be electrically connected to the first wiring. A gate of the first transistor included in the first circuit may be electrically connected to the second wiring. A gate of the first transistor included in the second circuit may be electrically connected to the second wiring. A gate of the fourth transistor may be electrically connected to the second wiring. A gate of the second transistor may be electrically connected to the third wiring. A gate of the fifth transistor may be electrically connected to the third wiring.

The circuit block includes a sixth transistor, a seventh transistor, a third capacitor, and an EL element as the display element, and may have the following structure: one electrode of the EL element is electrically connected to one of a source and a drain of the seventh transistor; the other of the source and the drain of the seventh transistor is electrically connected to one electrode of the third capacitor; the one electrode of the third capacitor is electrically connected to one of a source and a drain of the sixth transistor; a gate of the sixth transistor is electrically connected to the other electrode of the third capacitor; and the other electrode of the third capacitor is electrically connected to the one electrode of the first capacitor.

Alternatively, the circuit block includes a fourth capacitor and a liquid crystal element as the display element, and may have the following structure: one electrode of the liquid crystal element is electrically connected to one electrode of the fourth capacitor; and the one electrode of the fourth capacitor is electrically connected to the one electrode of the first capacitor.

The display device may further include an eighth transistor. The one electrode of the fourth capacitor may be electrically connected to one of a source and a drain of the eighth transistor, and the other of the source and the drain of the eighth transistor may be electrically connected to the one electrode of the first capacitor.

It is preferable that the first transistor include a metal oxide in a channel formation region and that the metal oxide include In, Zn, and M (M is Al, Ti, Ga, Sn, Y, Zr, La, Ce, Nd, or Hf).

Effect of the Invention

With the use of one embodiment of the present invention, a display device capable of improving higher image quality can be provided. Alternatively, a display device capable of performing proper display without image data conversion can be provided. Alternatively, a display device capable of performing HDR display can be provided. Alternatively, a display device capable of performing an upconversion operation can be provided. Alternatively, a display device capable of improving the luminance of a displayed image can be provided. Alternatively, a display device capable of displaying two or more images superimposed on each other can be provided. Alternatively, a display device in which a voltage higher than the output voltage of a driver circuit can be applied to a pixel circuit can be provided.

Alternatively, a display device with low power consumption can be provided. Alternatively, a highly reliable display device can be provided. Alternatively, a novel display device or the like can be provided. Alternatively, a method for driving any of the display devices can be provided. Alternatively, a novel semiconductor device or the like can be provided.

BRIEF DESCRIPTION OF THE DRAWINGS

FIG. 3 Timing charts each showing an operation of a pixel circuit.
FIG. 7 Diagrams each illustrating a circuit block.
FIG. 14 Block diagrams illustrating a display device.
FIG. 20 Diagrams showing a display device.
FIG. 22 Diagrams each illustrating a transistor.
FIG. 23 Diagrams each illustrating a transistor.
FIG. 24 Diagrams each illustrating a transistor.
FIG. 25 Diagrams each illustrating a transistor.

MODE FOR CARRYING OUT THE INVENTION

Figure 1:
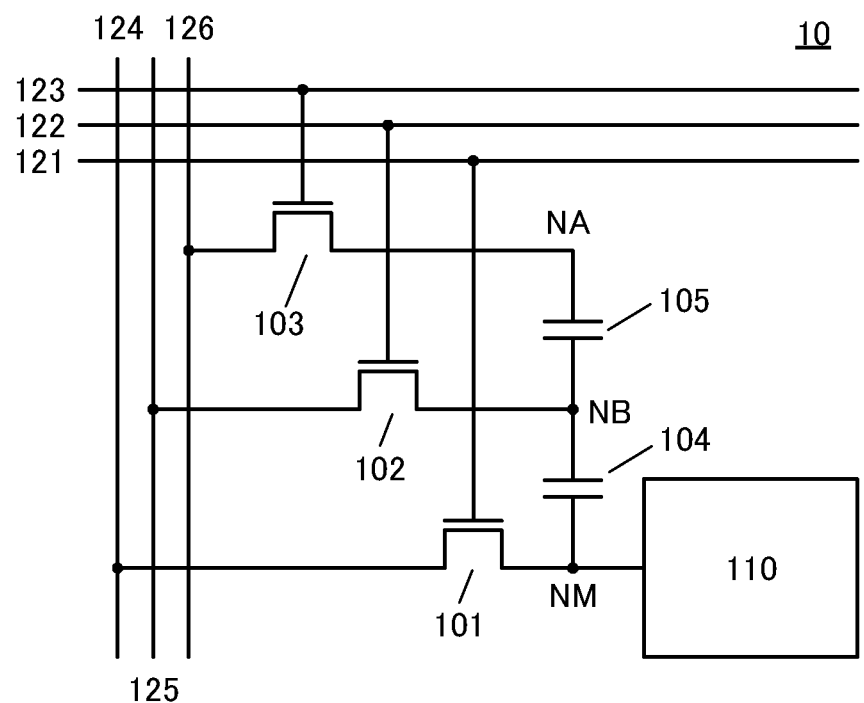
FIG. 1 A diagram illustrating a pixel circuit.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the invention described below, the same reference numerals are used in common, in different drawings, for the same portions or portions having similar functions, and repeated to description thereof is omitted in some cases. Note that the hatching of the same component that constitutes a drawing is omitted or changed as appropriate in different drawings in some cases.

Embodiment 1

In this embodiment, a display device of one embodiment of the present invention will be described with reference to drawings.

One embodiment of the present invention is a display device having a function of correcting image data in a pixel. A plurality of storage nodes are provided in series in each pixel, and a display element can operate in accordance with the sum of a plurality of pieces of input data.

Thus, the display device can perform image correction such as image upconversion, HDR display in which part of or the whole image in a display region is corrected, or improvement in the luminance of a displayed image. In addition, a plurality of images can be displayed superimposed on each other and a voltage higher than the output voltage of a driver circuit can be supplied to a pixel circuit.

Furthermore, with the use of one embodiment of the present invention, proper display can be performed without upconversion or downconversion of displayed images with different resolutions. For example, in the case of high-resolution display in a pixel configuration with three levels of resolution: high, middle, and low, individual data is supplied to each pixel through a first transistor included in the pixel. In the case of middle-resolution display, the same data is supplied to a plurality of pixels through a second transistor electrically connected to the plurality of pixels included in a first group. In the case of low-resolution display, the same data is supplied to a plurality of pixels through a third transistor electrically connected to the plurality of pixels included in a second group.

Here, the image data for a high resolution corresponds to, for example, data with the data amount corresponding to 8K4K (the number of pixels: 7680×4320). In addition, the image data for a middle resolution corresponds to, for example, data with the data amount for 4K2K (the number of pixels: 3840×2160). In addition, the image data for a low resolution corresponds to, for example, data with the data amount for Full-HD (the number of pixels: 1920×1080).

That is, it is assumed that the ratio of the amount of effective image data (corresponding to the number of effective pixels) in high-resolution image data to that in low-resolution image data, and the ratio of the amount of effective data in middle-resolution image data to that in low-resolution image data are each 4:1. In addition, the ratio of the amount of effective data in high-resolution image data to that in low-resolution image data is 16:1. Note that the number of pixels is not limited to the above example as long as the amount of data is within the above ratio, and may correspond to another standard.

FIG. 1 is a diagram illustrating a pixel 10 that can be used for a display device of one embodiment of the present invention. The pixel 10 includes two capacitors and can perform display in accordance with the sum of at most three pieces of data by capacitive coupling.

The pixel 10 includes a transistor 101, a transistor 102, a transistor 103, a capacitor 104, a capacitor 105, and a circuit block 110. The circuit block 110 can include a transistor, a capacitor, a display element, and the like and will be described in detail later.

One of a source and a drain of the transistor 101 is electrically connected to one electrode of the capacitor 104. The one electrode of the capacitor 104 is electrically connected to the circuit block 110. The other electrode of the capacitor 104 is electrically connected to one of a source and a drain of the transistor 102. The one of a source and a drain of the transistor 102 is electrically connected to one electrode of the capacitor 105. The other electrode of the capacitor 105 is electrically connected to one of a source and a drain of the transistor 103.

Here, a wiring to which the one of the source and the drain of the transistor 101, the one electrode of the capacitor 104, and the circuit block 110 are connected is referred to as a node NM. Note that a component of the circuit block 110 that is connected to the node NM can bring the node NM into a floating state. A wiring to which the other electrode of the capacitor 104, the one of the source and the drain of the transistor 102, and the one electrode of the capacitor 105 are connected is referred to as a node NB. A wiring to which the one of the source and the drain of the transistor 103 and the other electrode of the capacitor 105 are connected is referred to as a node NA.

A gate of the transistor 101 is electrically connected to a wiring 121. A gate of the transistor 102 is electrically connected to a wiring 122. A gate of the transistor 103 is electrically connected to a wiring 123. The other of the source and the drain of the transistor 101 is electrically connected to a wiring 124. The other of the source and the drain of the transistor 102 is electrically connected to a wiring 125. The other of the source and the drain of the transistor 103 is electrically connected to a wiring 126.

The wirings 121, 122, and 123 can have a function of a signal line for controlling the operation of the corresponding transistor. The wiring 124 can have a function of a signal line for supplying first data. The wiring 125 can have a function of a signal line for supplying second data. The wiring 126 can have a function of a signal line for supplying third data.

The node NM, the node NB and the node NA can each serve as a storage node. When the transistor 101 is turned on, the first data supplied to the wiring 124 can be written to the node NM. When the transistor 101 is turned off, the data can be held in the node NM. When the transistor 102 is turned on, the second data supplied to the wiring 125 can be written to the node NB. When the transistor 102 is turned off, the data can be held in the node NB. When the transistor 103 is turned on, the third data supplied to the wiring 126 can be written to the node NA. When the transistor 103 is turned off, the data can be held in the node NA.

With the use of a transistor with an extremely low off-state current as the transistors 101, 102, and 103, the potentials at the node NM and the node NB can be retained for a long time. As the transistor, a transistor using a metal oxide in a channel formation region (hereinafter referred to as an OS transistor) can be used, for example.

Note that an OS transistor may also be used as the other transistor included in the pixel. A transistor containing Si in a channel formation region (hereinafter referred to as a Si transistor) may be used as the transistor included in the pixel. Alternatively, both an OS transistor and a Si transistor may be used. Note that examples of the Si transistor include a transistor containing amorphous silicon and a transistor containing crystalline silicon (typically, low-temperature polysilicon or single crystal silicon).

As a semiconductor material used for an OS transistor, a metal oxide whose energy gap is greater than or equal to 2 eV, preferably greater than or equal to 2.5 eV, more preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that highly requires reliability, and the like. A CAC-OS has high mobility and thus is suitable for a transistor that operates at high speed, and the like.

An OS transistor has a large energy gap and thus exhibits extremely low off-state current characteristics. An OS transistor has the following feature different from that of a Si transistor: impact ionization, an avalanche breakdown, a short-channel effect, or the like does not occur and thus can configure a highly reliable circuit.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used to form a film of the In-M-Zn oxide satisfy In M and Zn M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the deposited semiconductor layer varies from the above atomic ratio of metal elements of the sputtering target in a range of ±40%.

An oxide semiconductor with low carrier density is used for the semiconductor layer. For example, an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, yet further preferably lower than $1 \Delta 10^{10}/cm^3$, and higher than or equal to $1 \times 10^{-9}/cm^3$ can be used for the semiconductor layer. Such an oxide semiconductor is referred to as a highly purified intrinsic or substantially highly purified intrinsic oxide semiconductor. The oxide semiconductor has a low density of defect states and thus can be regarded as an oxide semiconductor having stable characteristics.

Note that, without limitation to these, a material with an appropriate composition may be used in accordance with required semiconductor characteristics and electrical characteristics (e.g., field-effect mobility and threshold voltage) of a transistor. In order to obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to be appropriate.

When silicon or carbon, which is an element belonging to Group 14, is contained in the oxide semiconductor contained in the semiconductor layer, oxygen vacancies are increased, and the semiconductor layer becomes n-type. Thus, the concentration of silicon or carbon (measured by secondary ion mass spectrometry) in the semiconductor layer is set to lower than or equal to $2 \times 10^{18}$ atoms/cm$^3$, preferably lower than or equal to $2 \times 10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (measured by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the concentration of nitrogen in the semiconductor layer (the concentration obtained by secondary ion mass spectrometry) is preferably set to lower than or equal to $5\times10^{18}$ atoms/cm$^3$.

The semiconductor layer may have a non-single-crystal structure, for example. The non-single-crystal structure includes, for example, a CAAC-OS (C-Axis Aligned Crystalline Oxide Semiconductor) including a c-axis aligned crystal, a polycrystalline structure, a microcrystalline structure, or an amorphous structure. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of a region having an amorphous structure, a region having a microcrystalline structure, a region having a polycrystalline structure, a region of CAAC-OS, and a region having a single crystal structure. The mixed film has, for example, a single-layer structure or a stacked-layer structure including two or more of the above-described regions in some cases.

Described below is the composition of a CAC (Cloud-Aligned Composite)-OS, which is one embodiment of a non-single-crystal semiconductor layer.

The CAC-OS is, for example, a composition of a material in which elements included in an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that an oxide semiconductor preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, CAC-OS in an In—Ga—Zn oxide (of the CAC-OS, an In—Ga—Zn oxide may be particularly referred to as CAC-IGZO) has a composition (hereinafter, referred to as cloud-like composition) in which materials are separated into indium oxide (hereinafter, InO$_{X1}$ (X1 is a real number greater than 0)) or indium zinc oxide (hereinafter, In$_{X2}$Zn$_{Y2}$O$_{Z2}$ (X2, Y2, and Z2 are real numbers greater than 0)), and gallium oxide (hereinafter, GaO$_{X3}$ (X3 is a real number greater than 0)) or gallium zinc oxide (hereinafter, Ga$_{X4}$Zn$_{Y4}$O$_{Z4}$ (X4, Y4, and Z4 are real numbers greater than 0)) to form a mosaic pattern, and InO$_{X1}$ or In$_{X2}$Zn$_{Y2}$O$_{Z2}$ forming the mosaic pattern is evenly distributed in the film.

That is, the CAC-OS is a composite oxide semiconductor with a composition in which a region containing GaO$_{X3}$ as a main component and a region containing In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region is described as having higher In concentration than the second region.

Note that IGZO is a common name, which may specify a compound containing In, Ga, Zn, and O. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Thus, the crystal structure is a secondary element for the CAC-OS.

Note that in the CAC-OS, a stacked-layer structure including two or more films with different atomic ratios is not included. For example, a two-layer structure of a film containing In as a main component and a film containing Ga as a main component is not included.

Note that a boundary between the region containing GaO$_{X3}$ as a main component and the region containing In$_{X2}$Zn$_{Y2}$O$_{Z2}$ or InO$_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the metal element(s) as a main component(s) are observed in part of a CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally, for example. In the case where the CAC-OS is formed by a sputtering method, one or more selected from an inert gas (typically, argon), an oxygen gas, and a nitrogen gas may be used as a deposition gas. The ratio of the flow rate of the oxygen gas to the total flow rate of the deposition gas in deposition is preferably as low as possible; for example, the ratio of the flow rate of the oxygen gas is higher than or equal to 0% and lower than 30%, preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region and a plurality of bright spots in the ring region are observed. Thus, it is found from the electron diffraction pattern that the crystal structure of the CAC-OS includes an nc (nanocrystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a structure different from that of an IGZO compound in which metal elements are evenly distributed, and has characteristics different from those of the IGZO compound. That is, the CAC-OS has a composition in which regions containing $GaO_{X3}$ or the like as a main component and regions containing $In_{X2}Zn_{Y2}O_{Z2}$ or $InO_{X1}$ as a main component are phase-separated from each other, and the regions including the respective elements as the main components form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through regions containing $In_{X2}Zn_{Y2}O_{Z2}$ or $InO_{X1}$ as a main component, the conductivity of an oxide semiconductor is generated. Accordingly, when regions containing $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region containing $GaO_{X3}$ or the like as a main component is higher than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, in the case where a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element using a CAC-OS has high reliability. Thus, the CAC-OS is suitable as a constituent material in a variety of semiconductor devices.

With reference to timing charts shown in FIGS. 2(A), 2(B), and 2(C), an operation example of the pixel 10 in which the second data and the third data are added to the first data will be described. Note that in the following description, "H" represents a high potential and "L" represents a low potential. Furthermore, the first data, the second data, and the third data are represented by "$V_{data1}$", "$V_{data2}$", and "$V_{data3}$", respectively. A reference potential (e.g., 0 V, a GND potential, or a given potential) is represented by "$V_{ref}$". Note that the first data to the third data may each have a negative value to be used for subtraction.

First, an operation of writing the first data "$V_{data1}$" to the node NM will be described with reference to FIG. 2(A). Note that ideal operations are described here, and in potential distribution, potential coupling, or potential loss, detailed potential changes due to a circuit configuration, operation timing, or the like are not considered. In addition, a potential change due to capacitive coupling depends on the ratio of the capacitance of a potential supplier to that of a potential receiver; however, for clear explanation, the capacitance values of the node NB and the node NM are assumed to be sufficiently small.

At Time T1, the potential of the wiring 121 is set to "H", the potential of the wiring 122 is set to "H", the potential of the wiring 124 is set to "$V_{data1}$", and the potential of the wiring 125 is set to "$V_{ref}$"; thus, the transistor 102 is turned on and the potential of the node NB becomes "$V_{ref}$". The operation is a reset operation for performing subsequent capacitive coupling operation.

In addition, the transistor 101 is turned on, and the potential of the wiring 124 (the first data "$V_{data1}$") is written to the node NM.

At Time T2, the potential of the wiring 121 is set to "L", and the potential of the wiring 122 is set to "L", so that the transistor 101 and the transistor 102 are turned off and the first data "$V_{data1}$" is retained in the node NM. In addition, "$V_{data1}-V_{ref}$" is retained in the capacitor 104.

The operation of writing the first data "$V_{data1}$" has been described so far. Note that in the case where the first data is not reflected in display, the same potential as "$V_{ref}$" is supplied as the first data "$V_{data1}$".

Next, an operation of writing the second data "$V_{data2}$" to the node NB will be described with reference to FIG. 2(B).

At Time T11, the potential of the wiring 122 is set to "H", the potential of the wiring 123 is set to "H", the potential of the wiring 125 is set to "$V_{data2}$", and the potential of the wiring 126 is set to "$V_{ref}$"; thus, the transistor 103 is turned on and the potential of the node NA becomes "$V_{ref}$". The operation is a reset operation for performing subsequent capacitive coupling operation.

In addition, the transistor 102 is turned on, and the potential of the wiring 125 (the second data "$V_{data2}$") is written to the node NB.

At this time, the potential of the node NB is added to the potential of the node NM by capacitive coupling of the capacitor 104. Thus, the potential of the node NM becomes "$V_{data1}-V_{ref}+V_{data2}$", and when "$V_{ref}$"=0, the potential of the node NM becomes "$V_{data1}+V_{data2}$".

At Time T12, the potential of the wiring 122 is set to "L" and the potential of the wiring 123 is set to "L", so that the transistor 102 is turned off and the second data "$V_{data2}$" is retained in the node NB. Furthermore, "$V_{data1}+V_{data2}$", which is the sum of the first data and the second data, is retained in the node NM. In addition, "$V_{data2}-V_{ref}$" is retained in the capacitor 105.

The operation of writing the second data "$V_{data2}$" has been described so far. Note that in the case where the second data is not reflected in display, the same potential as "$V_{ref}$" can be supplied as the second data "$V_{data2}$".

Next, an operation of writing the third data "$V_{data3}$" will be described with reference to FIG. 2(C).

At Time T21, the potential of the wiring 123 is set to "H" and the potential of the wiring 126 is set to "$V_{data3}$", so that the transistor 103 is turned on and the potential of the node NA becomes "$V_{data3}$".

At this time, the potential of the node NA is added to the potential of the node NB by capacitive coupling of the capacitor 105. Thus, the potential of the node NB becomes "$V_{data2}-V_{ref}V_{data3}$", and when "$V_{ref}$"=0, the potential of the node NB becomes "$V_{data2}+V_{data3}$".

Furthermore, the potential of the node NB is added to the potential of the node NM by capacitive coupling of the capacitor 104. Accordingly, the potential of the node NM becomes "$V_{data1}+V_{data\ 2}+V_{data3}$".

At Time T22, the potential of the wiring 123 is set to "L", so that the transistor 103 is turned off and the potential of the node NM is held at "$V_{data1}+V_{data\ 2}+V_{data3}$".

Thus, the writing operations of the first data "$V_{data1}$" to the third data "$V_{data3}$" are completed. Note that in the case where the third data is not reflected in display, the same potential as "$V_{ref}$" can be supplied as the third data "$V_{data3}$". Alternatively, the writing operation of the third data may be omitted.

After that, the display element included in the circuit block 110 performs the display operation in accordance with the potential of the node NM. Note that depending on the configuration of the circuit block, the display operation might start at Time Ti or Time T11.

Figure 2A:
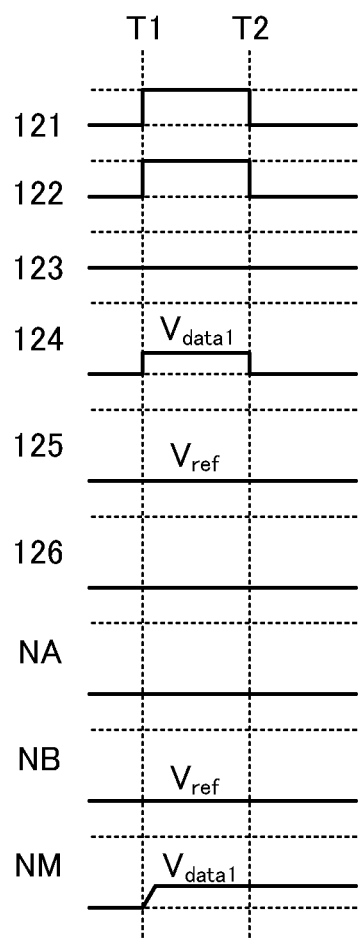
FIG. 2 Timing charts each showing an operation of a pixel circuit.
Figure 2B:
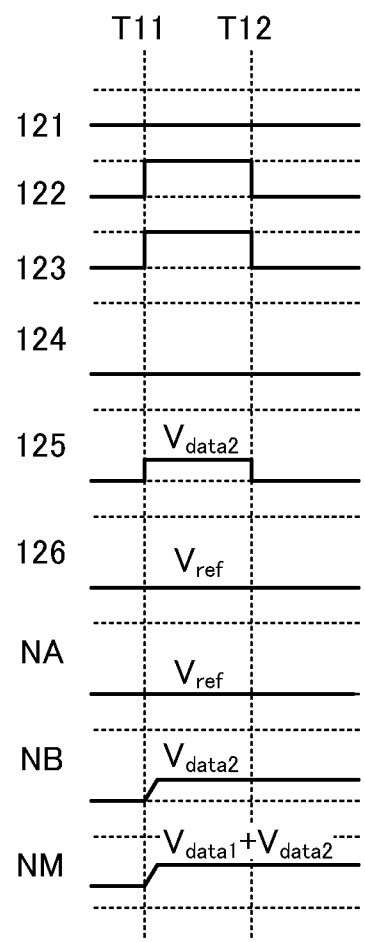

As illustrated in FIGS. 3(A), 3(B), and 3(C), the order of the operation shown in FIG. 2(A) and the operation shown in FIG. 2(B) may be reversed.

An operation of writing the first data "$V_{data2}$" to the node NB will be described with reference to FIG. 3(A).

At Time Ti, the potential of the wiring 122 is set to "H", the potential of the wiring 123 is set to "H", the potential of the wiring 125 is set to "$V_{data2}$", and the potential of the wiring 126 is set to "$V_{ref}$"; thus, the transistor 103 is turned on, and the potential of the node NA becomes "$V_{ref}$". In addition, the transistor 102 is turned on, and the potential of the wiring 125 (the second data "$V_{data2}$") is written to the node NB.

At Time T2, the potential of the wiring 122 is set to "L" and the potential of the wiring 123 is set to "L", so that the transistor 102 and the transistor 103 are turned off and the second data "$V_{data2}$" is retained in the node NB. In addition, "$V_{data2}-V_{ref}$" is retained in the capacitor 105.

Next, an operation of writing the first data "$V_{data1}$" to the node NM will be described with reference to FIG. 3(B).

At Time T11, the potential of the wiring 121 is set to "H", the potential of the wiring 122 is set to "H", the potential of the wiring 124 is set to "$V_{data1}$", and the potential of the wiring 125 is set to "$V_{ref}$"; thus, the transistor 102 is turned on, and the potential of the node NB becomes "$V_{ref}$". In addition, the transistor 101 is turned on, and the potential of the wiring 124 (the first data "$V_{data1}$") is written to the node MN.

At Time T12, the potential of the wiring 121 is set to "L" and the potential of the wiring 122 is set to "L", so that the transistor 102 is turned off and "$V_{ref}$" is retained in the node NB. In addition, the first data "$V_{data1}$" is retained in the node NM. Furthermore, since "$V_{data2}-V_{ref}$" is retained in the capacitor 105, when "$V_{ref}$"=0, the potential of the node NA becomes "$-V_{data1}$".

Next, an operation of writing the third data "$V_{data3}$" will be described with reference to FIG. 3(C).

At Time T21, the potential of the wiring 123 is set to "H" and the potential of the wiring 126 is set to "$V_{data3}$", so that the transistor 103 is turned on and the potential of the node NA becomes "$V_{data3}$".

At this time, the potential of the node NA is added to the potential of the node NB by capacitive coupling of the capacitor 105. Thus, the potential of the node NB becomes "$V_{data3}-(-V_{data2})+V_{ref}$" and when "$V_{ref}$"=0, the potential of the node NB becomes "$V_{data2}+V_{data3}$".

In addition, the potential of the node NB is added to the potential of the node NM by capacitive coupling of the capacitor 104. Accordingly, the potential of the node NM becomes "$V_{data1}+V_{data2}+V_{data3}$".

At Time T22, the potential of the wiring 123 is set to "L", so that the transistor 103 is turned off, and the potential of the node NM is held at "$V_{data1}+V_{data2}+V_{data3}$".

Figure 2C:
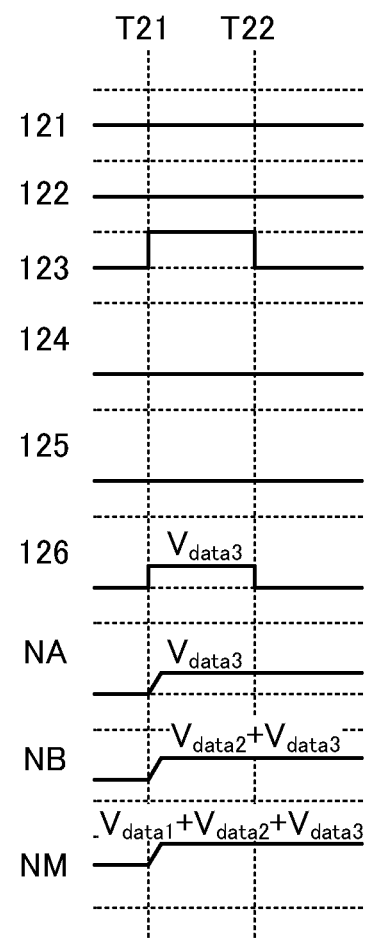

Thus, the writing operations of the first data "$V_{data1}$" to the third data "$V_{data3}$" are completed Note that the operations in FIGS. 2(A), 2(B), and 2(C) can be sequentially performed in one horizontal period. Alternatively, the operation in FIG. 2(A) may be performed in a k-th frame (k is a natural number), and the operation in FIGS. 2(B) and 2(C) may be performed in a. (k+1)th frame. Alternatively, the operation in FIGS. 2(A) and 2(B) may be performed in the k-th frame, and the operation in FIG. 2(C) may be performed in the (k+1)th frame. Alternatively, operations in FIGS. 2(A), 2(B), and 2(C) may be performed in consecutive different frames. Alternatively, the operation in FIG. 2(A) may be performed in the k-th frame, and the operations in FIGS. 2(B) and 2(C) may be repeated in and after the (k+1)th frame. Alternatively, the operations in FIGS. 2(A) and 2(B) may be performed in the k-th frame, and the operation in FIG. 2(C) may be repeated in and after the (k+1)th frame. Note that the operations in FIGS. 3(A), 3(B), and 3(C) can also be performed in a similar manner. Furthermore, the above operations can be applied to a pixel with another structure in this embodiment.

Figure 4A:
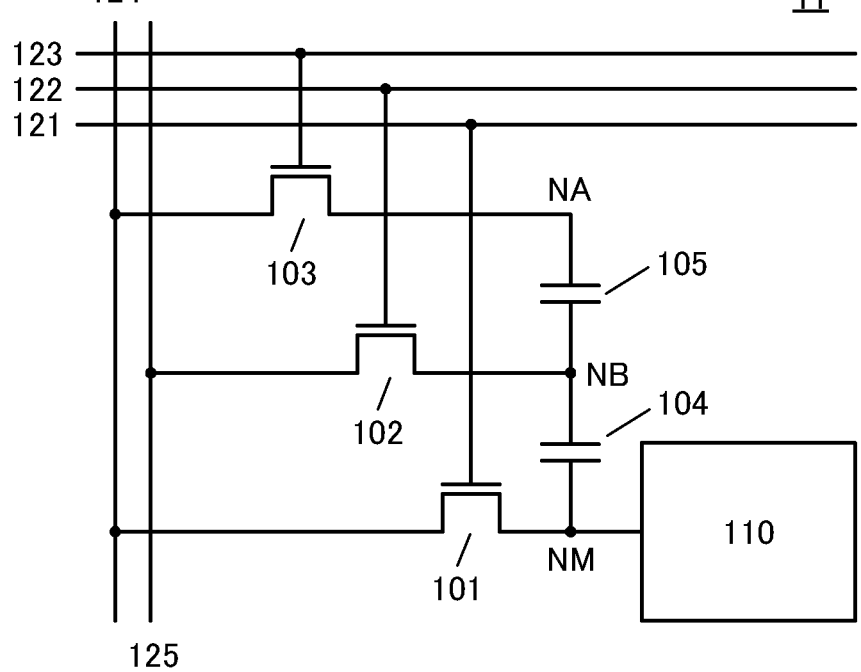
FIG. 4 A diagram illustrating a pixel circuit and timing charts each showing an operation of a pixel circuit.

A pixel that can be used for a display device of one embodiment of the present invention may have a structure of a pixel 11 illustrated in FIG. 4(A). In the pixel 11, the other of the source and the drain of the transistor 103 is electrically connected to the wiring 124. Thus, the wiring 126 can be omitted. The other structures are the same as those of the pixel 10.

Figure 4B:
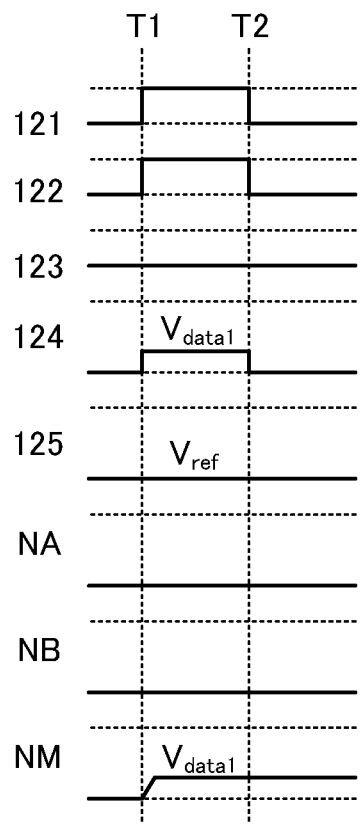
Figure 4C:
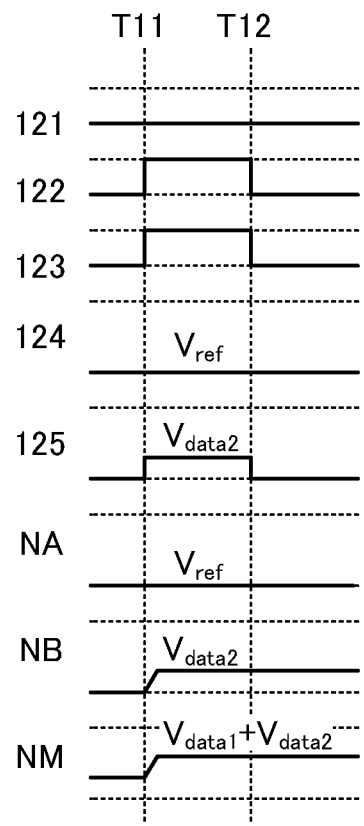
Figure 4D:
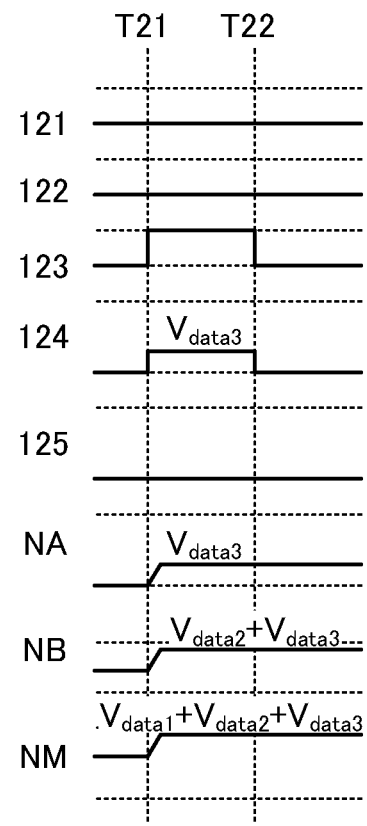

An operation example of the pixel 11 in which the second data and the third data are added to the first data will be described with reference to timing charts shown in FIGS. 4(B), 4(C), and 4(D). Since the procedure for writing the first data shown in FIG. 4(B) is substantially the same as that in the pixel 10, the description thereof is omitted.

An operation of writing the second data "$V_{data2}$" to the node NB will be described with reference to FIG. 4(C).

At Time T11, the potential of the wiring 122 is set to "H", the potential of the wiring 123 is set to "H", the potential of the wiring 124 is set to "$V_{ref}$", and the potential of the wiring 125 is set to "$V_{data2}$"; thus, the transistor 103 is turned on, and the potential of the node NA becomes "$V_{ref}$". The operation is a reset operation for performing subsequent capacitive coupling operation.

In addition, the transistor 102 is turned on, and the potential of the wiring 125 (the second data "$V_{data2}$") is written to the node NB.

At this time, the potential of the node NB is added to the potential of the node NM by capacitive coupling of the capacitor 104. Thus, the potential of the node NM becomes "$V_{data1}-V_{ref}+V_{data2}$" and when "$V_{ref}$"=0, the potential of the node NM becomes "$V_{data1}+V_{data2}$".

At Time T12, the potential of the wiring 122 is set to "L" and the potential of the wiring 123 is "L", so that the transistor 102 is turned off and the second data "$V_{data2}$" is retained in the node NB. Furthermore, "$V_{data1}+V_{data2}$", which is the sum of the first data and the second data, is retained in the node NM. In addition, "$V_{data2}-V_{ref}$" is retained in the capacitor 105.

The operation of writing the second data "$V_{data2}$" has been described so far. Note that in the case where the second data is not reflected in display, the same potential as "Val" can be supplied as the second data "$V_{data2}$".

Next, an operation of writing the third data "$V_{data3}$" will be described with reference to FIG. 4(D).

At Time T21, the potential of the wiring 123 is set to "H" and the potential of the wiring 124 is set to "$V_{data3}$", so that the transistor 103 is turned on and the potential of the node NA becomes "$V_{data3}$".

At this time, the potential of the other electrode of the capacitor 105 is added to the potential of the node NB by capacitive coupling of the capacitor 105. Thus, the potential of the node NB becomes "$V_{data2}-V_{ref}+V_{data3}$", and when "$V_{ref}$"=0, the potential of the node NB becomes "$V_{data2}+V_{data3}$".

In addition, the potential of the node NB is added to the potential of the node NM by capacitive coupling of the capacitor 104. Accordingly, the potential of the node NM becomes "$V_{data1}+V_{data\ 2}+V_{data3}$".

At Time T22, the potential of the wiring 123 is set to "L", so that the transistor 103 is turned off and the potential of the node NM is held at "$V_{data1}+V_{data\ 2}+V_{data3}$".

Thus, the writing operations of the first data "$V_{data1}$" to the third data "$V_{data3}$" are completed. Note that in the case where the third data is not reflected in display, the same potential as "$V_{ref}$" can be supplied as the third data "$V_{data3}$". Alternatively, the writing operation of the third data may be omitted.

After that, the display element included in the circuit block 110 performs the display operation in accordance with the potential of the node NM. Note that depending on the configuration of the circuit block, the display operation might start at Time T1 or Time T11.

As described above, the first data and the third data can be supplied through the wiring 124, so that the number of wirings can be reduced. Although description is omitted, operations corresponding to those in FIGS. 3(A) to 3(C) can be performed also in the pixel 11.

Figure 5A:
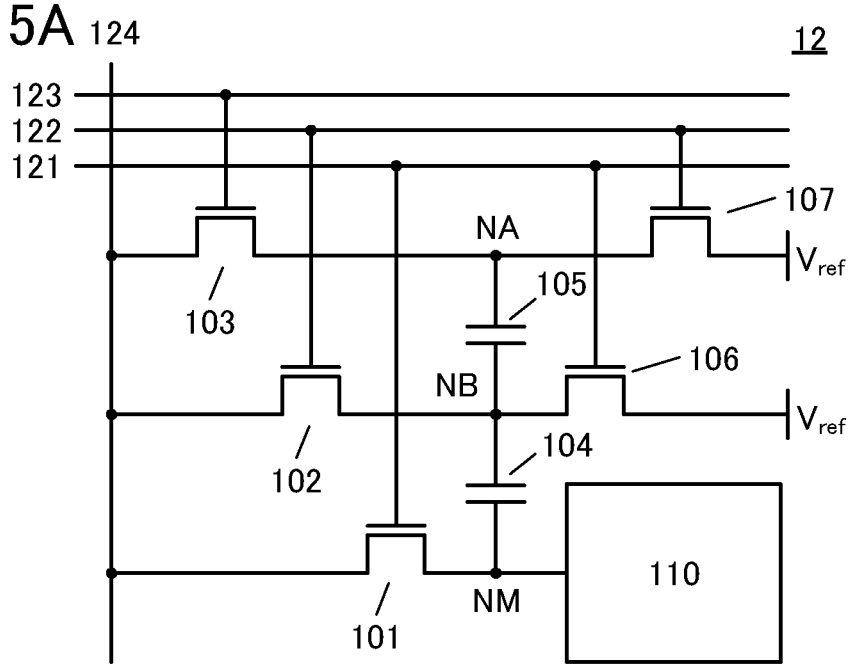
FIG. 5 A diagram illustrating a pixel circuit and timing charts each showing an operation of a pixel circuit.

A pixel that can be used for a display device of one embodiment of the present invention may have a structure of a pixel 12 illustrated in FIG. 5(A). The pixel 12 has a structure in which a transistor 106 and a transistor 107 are added to the components of the pixel 10. Furthermore, the wiring 125 and the wiring 126 which are needed for the pixel 10 can be omitted. The other components are the same as those of the pixel 10.

In the pixel 12, the other of the source and the drain of the transistor 102 is electrically connected to the wiring 124. The other of the source and the drain of the transistor 103 is electrically connected to the wiring 124.

One of a source and a drain of the transistor 106 is electrically connected to the other electrode of the capacitor 104. One of a source and a drain of the transistor 107 is electrically connected to the other electrode of the capacitor 105. A gate of the transistor 106 is electrically connected to the wiring 121. A gate of the transistor 107 is electrically connected to the wiring 122.

The other of the source and the drain of the transistor 106 is electrically connected to a wiring capable of supplying a reference potential "$V_{ref}$". The other of the source and the drain of the transistor 107 is electrically connected to a wiring capable of supplying the reference potential "$V_{ref}$". As the wiring capable of supplying the "$V_{ref}$", for example, a power supply line electrically connected to a component of the circuit block 110 can be used.

Note that in order to efficiently perform capacitive coupling operation, it is preferable that the potential of the electrode opposite to the electrode to which data of the capacitor is written be much lower than that of the data, e.g., "$V_{ref}$".

The pixel 10 has a structure in which supply of data and supply of "$F_{ref}$" are performed through the same wiring, whereas "$V_{ref}$" is supplied through a power source line or the like in the pixel 12; thus, the first data to the third data can be supplied through one wiring (the wiring 124). This enables the wiring 125 and the wiring 126 to be omitted, leading to reduction in the number of wirings.

Figure 5B:
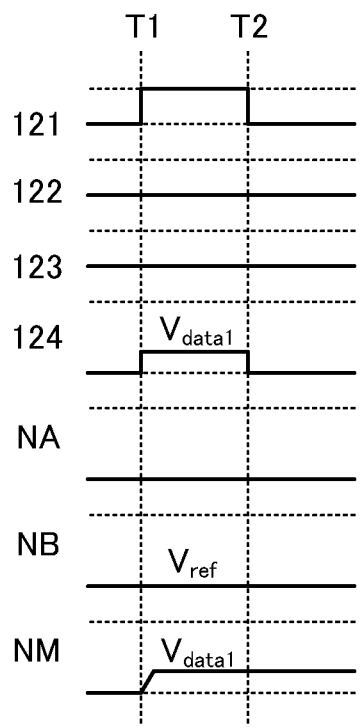
Figure 5C:
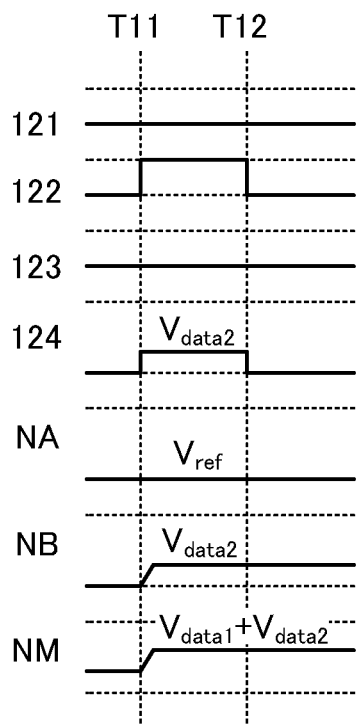
Figure 5D:
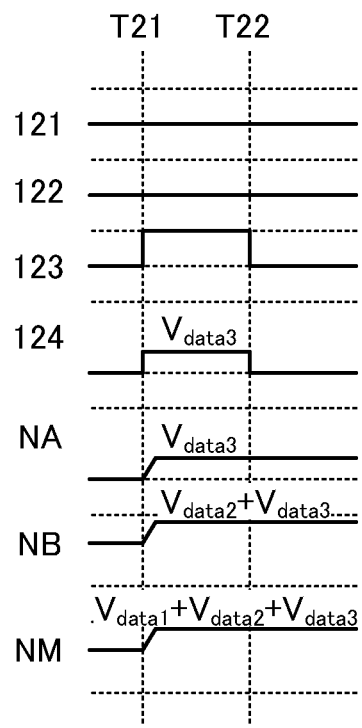

An operation example of the pixel 12 in which the second data and the third data are added to the first data will be described with reference to timing charts shown in FIGS. 5(B), 5(C), and 5(D).

First, the operation of writing the first data "$V_{data1}$" to the node NM will be described with reference to FIG. 5(B).

At Time T1, the potential of the wiring 121 is set to "H" and the potential of the wiring 124 is set to "$V_{data1}$", so that the transistor 106 is turned on and the potential of the node NB becomes "$V_{ref}$". The operation is a reset operation for performing subsequent capacitive coupling operation.

In addition, the transistor 101 is turned on, and the potential of the wiring 124 (the first data "$V_{data1}$" is written to the node NM.

At Time T2, the potential of the wiring 121 is set to "L", so that the transistor 101 and the transistor 106 are turned off and the first data "$V_{data1}$" is retained in the node NM, In addition, "$V_{data1}-V_{ref}$" is retained in the capacitor 104.

The operation of writing the first data "$V_{data1}$" has been described so far. Note that in the case where the first data is not reflected in display, the same potential as "$V_{ref}$" can be supplied as the first data "$V_{data1}$".

Next, an operation of writing the second data "$V_{data2}$" to the node NB will be described with reference to FIG. 5(C).

At Time T11, the potential of the wiring 122 is set to "H", the potential of the wiring 123 is set to "H", the potential of the wiring 125 is set to "$V_{data2}$", and the potential of the wiring 126 is set to "$V_{ref}$"; thus, the transistor 103 is turned on, and the potential of the node NA becomes "$V_{ref}$". The operation is a reset operation for performing subsequent capacitive coupling operation.

In addition, the transistor 102 is turned on, and the potential of the wiring 125 (the second data "$V_{data2}$") is written to the node NB.

At this time, the potential of the node NB is added to the potential of the node NM by capacitive coupling of the capacitor 104. Thus, the potential of the node NM becomes "$V_{data1}-V_{ref}+V_{data2}$", and when "$V_{ref}$"=0, the potential of the node NM becomes "$V_{data2}$".

At Time T12, the potential of the wiring 122 is set to "L" and the potential of the wiring 123 is set to "L", so that the transistor 102 is turned off and the second data "$V_{data2}$" is retained in the node NB. Furthermore, "$V_{data1}+V_{data2}$", which is the sum of the first data and the second data, is retained in the node NM. In addition, "$V_{data2}-V_{ref}$" is retained in the capacitor 105.

The operation of writing the second data "$V_{data2}$" has been described so far. Note that in the case where the second data is not reflected in display, the same potential as "$V_{ref}$" can be supplied as the second data "$V_{data2}$".

Next, an operation of writing the third data "$V_{data3}$" will be described with reference to FIG. 5(D).

At Time T21, the potential of the wiring 123 is set to "H" and the potential of the wiring 126 is set to "$V_{data3}$", so that the transistor 103 is turned on and the potential of the node NA becomes "$V_{data3}$".

At this time, the potential of the other electrode of the capacitor 105 is added to the potential of the node NB by capacitive coupling of the capacitor 105. Thus, the potential of the node NB becomes "$V_{data2}-V_{ref}+V_{data3}$", and when "$V_{ref}$"=0, the potential of the node NB becomes "$V_{data2}+V_{data3}$".

Furthermore, the potential of the node NB is added to the potential of the node NM by capacitive coupling of the capacitor 104. Accordingly, the potential of the node NM becomes "$V_{data1}+V_{data\ 2}+V_{data3}$".

At Time 122, the potential of the wiring 123 is set to so that the transistor 103 is turned off and the potential of the node NM is held at "$V_{data1}+V_{data\ 2}+V_{data3}$".

Thus, the writing operations of the first data "$V_{data1}$" to the third data "$V_{data3}$" are completed. Note that in the case where the third data is not reflected in display, the same potential as "$V_{ref}$" can be supplied as the third data "$V_{data3}$". Alternatively, the writing operation of the third data may be omitted.

After that, the display element included in the circuit block 110 performs the display operation in accordance with the potential of the node NM. Note that depending on the configuration of the circuit block, the display operation might start at Time T1 or Time T11. Although description is omitted, operations corresponding to those in FIGS. 3(A) to 3(C) can be performed in the pixel 13.

Figure 6:
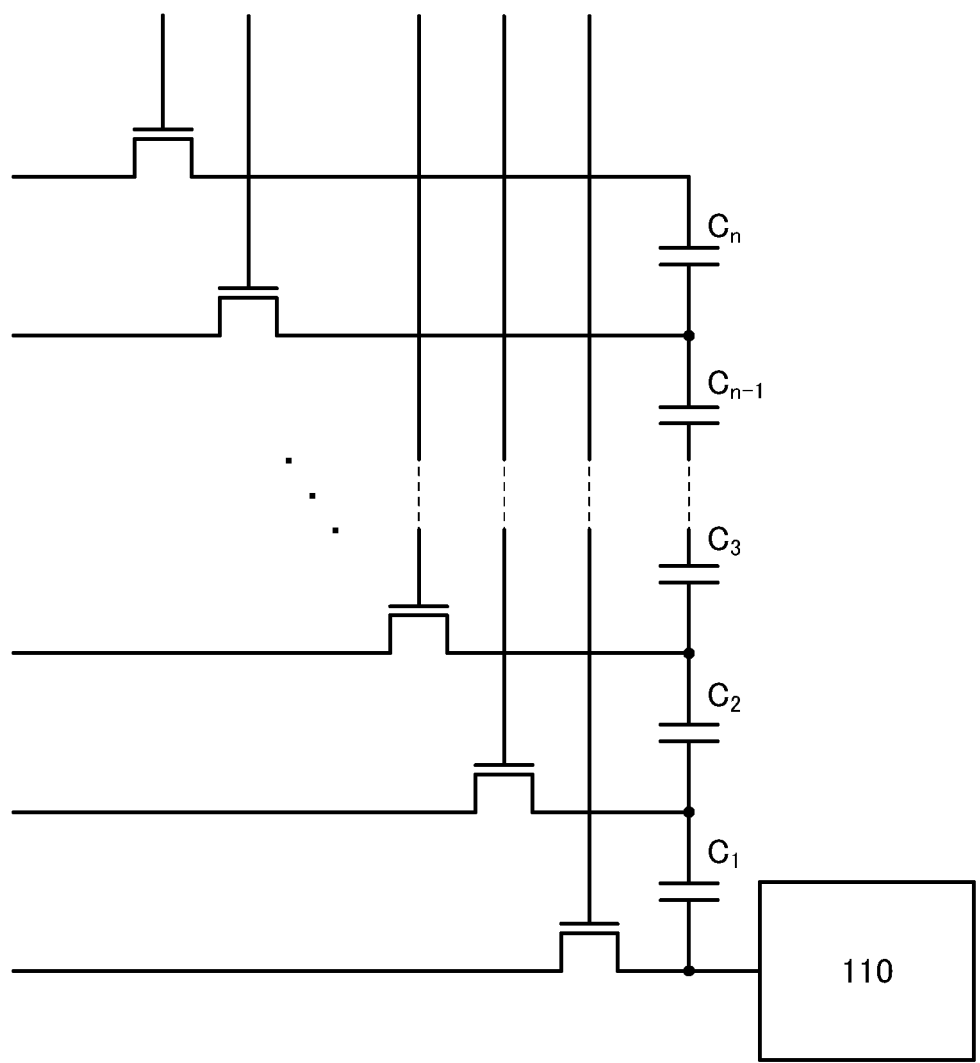
FIG. 6 a diagram illustrating a pixel circuit.

Although structure examples where two capacitors are connected in series are shown in the pixels 10, 11, and 12, a structure may be employed in which more capacitors, capacitors $C_1$ to $C_n$, are connected in series as illustrated in FIG. 6. In this case, one transistor is added each time when one capacitor is added. One of a source and a drain of the transistor is electrically connected to a wiring that connects one capacitor and the other capacitor. That is, the number of nodes such as the node NB increases in this structure.

The number n of capacitors connected in series is preferably 2 to 8, further preferably 2 to 6, still further preferably 2 to 4. The larger number of capacitors can enhance the effect of one embodiment of the present invention. However, it is necessary to increase the number of transistors and the number of signal lines with an increase in the number of capacitors, which might cause a problem such as a lower aperture ratio of a pixel, a lower resolution, and difficulty in securing signal input time. For this reason, the number n of capacitors connected in series is preferably within the above range depending on the use.

FIGS. 7(A) to 7(C) are examples of a structure including an EL element as the display element, which can be applied to the circuit block 110.

The structure illustrated in FIG. 7(A) includes a transistor 111, a capacitor 113, and an EL element 114. One of a source and a drain of the transistor 111 is electrically connected to one electrode of the EL element 114. The one electrode of the EL element 114 is electrically connected to one electrode of the capacitor 113. The other electrode of the capacitor 113 is electrically connected to a gate of the transistor 111. The gate of the transistor 111 is electrically connected to the node NM.

The other of the source and the drain of the transistor 111 is electrically connected to a wiring 128. The other electrode of the EL element 114 is electrically connected to a wiring 129. The wirings 128 and 129 each have a function of supplying power. For example, the wiring 128 can supply a high power supply potential. In addition, the wiring 129 can supply a low power supply potential.

In the structure illustrated in FIG. 7(A), current flows through the EL element 114 when the potential of the node NM becomes equal to or higher than the threshold voltage of the transistor III. Therefore, in some cases, the EL element 114 starts to emit light at Time T1 shown in the timing charts shown in FIG. 2(A), FIG. 3(4), FIG. 4(B), and FIG. 5(B); this might limit the uses.

FIG. 7(B) is a structure in which a transistor 112 is added to the structure in FIG. 4(A). One of a source and a drain of the transistor 112 is electrically connected to the one of the source and the drain of the transistor 111. The other of the source and the drain of the transistor 112 is electrically connected to the EL element 114. A gate of the transistor 112 is electrically connected to a wiring 127. The wiring 127 can have a function of a signal line that controls the conduction of the transistor 112.

In the structure, current flows through the EL element 114 when the potential of the node NM is equal to or higher than the threshold voltage of the transistor 111 and the transistor 112 is turned on. Therefore, the EL element 114 can start to emit light at or after Time T22 in the timing charts shown in FIG. 2(C), FIG. 3(C), FIG. 4(D), and FIG. 5(D), which is suitable for operation that requires correction.

FIG. 7(C) is a structure in which a transistor 115 is added to the structure in FIG. 6(B). One of a source and a drain of the transistor 115 is electrically connected to the one of the source and the drain of the transistor 111. The other of the source and the drain of the transistor 115 is electrically connected to a wiring 130. A gate of the transistor 115 is electrically connected to a wiring 131. The wiring 131 can have a function of a signal line that controls the conduction of the transistor 115. Note that the gate of the transistor 115 may be electrically connected to the wiring 123.

The wiring 130 can be electrically connected to a supply source of a certain potential such as a reference potential. In addition, supplying a certain potential from the wiring 130 to the one of the source and the drain of the transistor 111 can stabilize image data writing.

In addition, the wiring 130 can be connected to a circuit 120 and can also have a function of a monitor line. The circuit 120 can have one or more of the function of supplying the above certain potential, the function of obtaining electric characteristics of the transistor 111, and the function of generating correction data.

In the case where the wiring 130 functions as a monitor line, the circuit 120 can generate a potential for correcting the threshold voltage of the transistor 111 as the first data to be written to the node NM, for example.

Here, the transistor 106 and the transistor 107 for supplying "$V_{ref}$" illustrated in FIG. 5(A) can be electrically connected to the wiring 128 as illustrated in FIG. 7(D). Since "$V_{ref}$" is preferably 0 V, GND, or a low potential, the wiring 128 also has a function of supplying at least any of these potentials. To the wiring 128, "$V_{ref}$" is supplied at the timing when data is written to the node NM or the node NB, and a high power supply potential is supplied at the timing when the EL element 114 emits light.

Figure 8A:
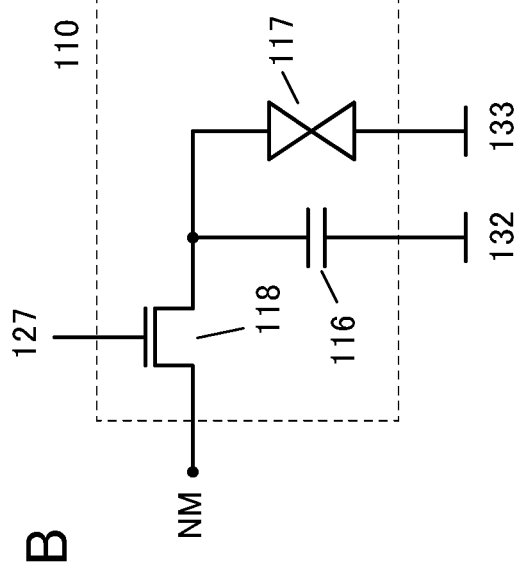
FIG. 8 Diagrams each illustrating a circuit block.
Figure 8B:
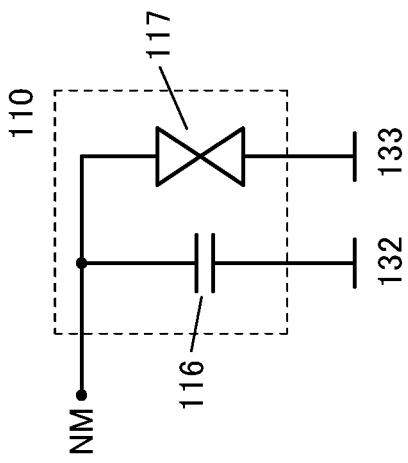
Figure 8C:
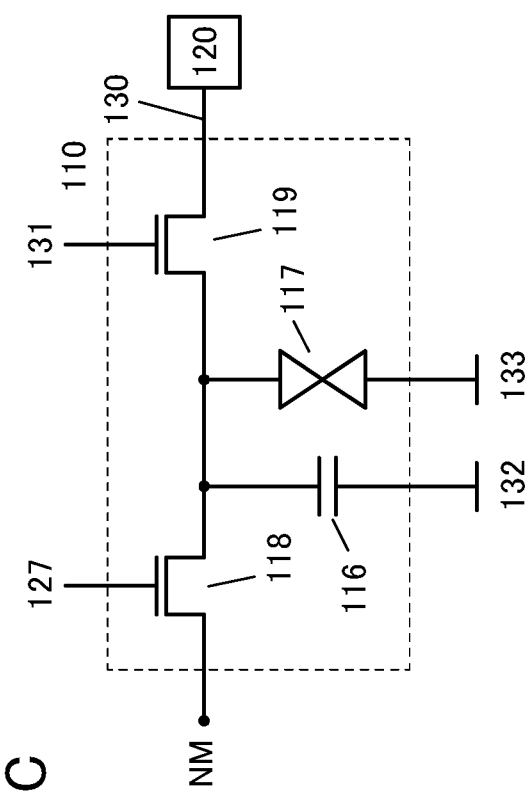

FIGS. 8(A) to 8(C) each illustrate an example of a structure including a liquid crystal element as the display element, which can be applied to the circuit block 110.

The structure illustrated in FIG. 8(A) includes a capacitor 116 and a liquid crystal element 117. One electrode of the liquid crystal element 117 is electrically connected to one electrode of the capacitor 116. The one electrode of the capacitor 116 is electrically connected to the node NM.

The other electrode of the capacitor 116 is electrically connected to a wiring 132. The other electrode of the liquid crystal element 117 is electrically connected to a wiring 133. The wirings 132 and 133 each have a function of supplying power. For example, the wirings 132 and 133 can each supply a reference potential such as GND or 0 V or a given potential.

In this structure, the operation of the liquid crystal element 117 starts when the potential of the node NM becomes equal to or higher than the operation threshold of the liquid crystal element 117. Therefore, in some cases, the display operation starts at Time T1 in the timing charts shown in FIG. 2(A), FIG. 3(A), FIG. 4(B), and FIG. 5(B), which limits the uses. Note that in the case of a transmissive liquid crystal display device, the combination of the operation of, for example, turning off a backlight until Time T22 shown in FIG. 2(C), FIG. 3(C), FIG. 4(D), and FIG. 5(D) can inhibit unnecessary display operation from being visually identified.

FIG. 8(B) is a stricture in which a transistor 118 is added to the structure in FIG. 8(A). One of a source and a drain of the transistor 118 is electrically connected to the one electrode of the capacitor 116. The other of the source and the drain of the transistor 118 is electrically connected to the node NM. A gate of the transistor 118 is electrically connected to the wiring 127. The wiring 127 can have a function of a signal line that controls the conduction of the transistor 118.

In this configuration, the potential of the node NM is applied to the liquid crystal element 117 when the transistor 118 is turned on. Therefore, the operation of the liquid crystal element can start at or after Time T22 in the timing charts shown in FIG. 2(C), FIG. 3(C), FIG. 4(D), and FIG. 5(D), which is suitable for the operation that requires correction.

Note that while the transistor 118 is in a non-conducting state, potentials supplied to the capacitor 116 and the liquid crystal element 117 are retained continuously; thus, the potentials supplied to the capacitor 116 and the liquid crystal element 117 are preferably reset before image data rewriting. For the reset, a reset potential may be supplied to the wiring 123 to bring the transistor 103 and the transistor 118 into conduction at the same time, for example.

FIG. 8(C) is a structure in which a transistor 119 is added to the structure in FIG. 8(B). One of a source and a drain of the transistor 119 is electrically connected to the one electrode of the liquid crystal element 117. The other of the source and the drain of the transistor 119 is electrically connected to the wiring 130. A gate of the transistor 119 is electrically connected to the wiring 131. The wiring 131 can have a function of a signal line that controls the conduction of the transistor 119, Note that the gate of the transistor 119 may be electrically connected to the wiring 123.

The circuit 120 electrically connected to the wiring 130 is similar to that described with reference to FIG. 7(C), and may have a function of resetting the potentials supplied to the capacitor 116 and the liquid crystal element 117.

Figure 8D:
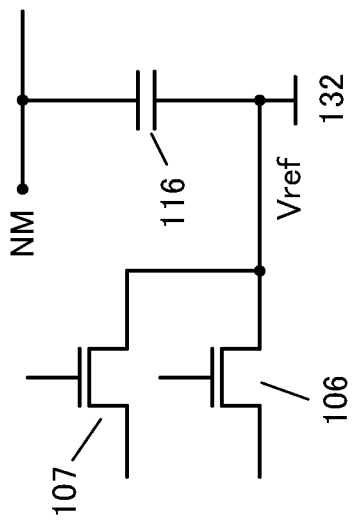

In addition, the transistor 106 and the transistor 107 for supplying "$V_{ref}$" illustrated in FIG. 5(A) can be electrically connected to the wiring 132 as illustrated in FIG. 8(D).

Figure 9A:
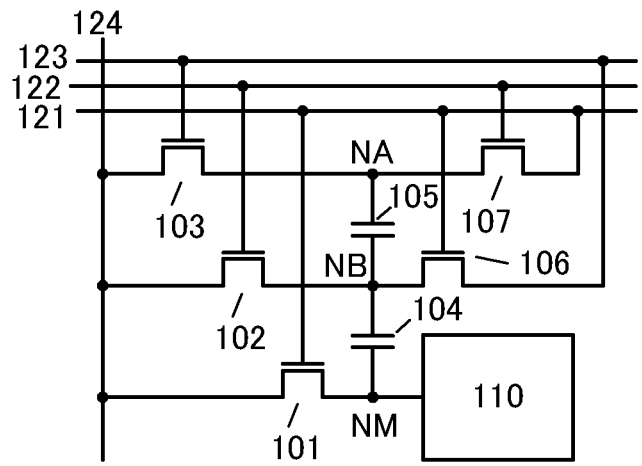
FIG. 9 Diagrams each illustrating a pixel circuit.

Although the examples in which "$V_{ref}$" is supplied from the power supply line are shown in FIG. 7(D) and FIG. 8(D), "$V_{ref}$" can be supplied from a scan line. For example, "$V_{ref}$" may be supplied from the wiring 121 or the wiring 123 as illustrated in FIG. 9(A). For example, since a potential corresponding to "L" is supplied to the wiring 123 when data is written to the node NM (when the transistor 101 is turned on), as illustrated in FIG. 2(A), this potential can be used as "$V_{ref}$". Furthermore, since a potential corresponding to "L" is supplied to the wiring 121 when data is written to the node NB (when the transistor 102 is turned on), as illustrated in FIG. 2(B), this potential can be used as "$V_{ref}$".

Figure 9B:
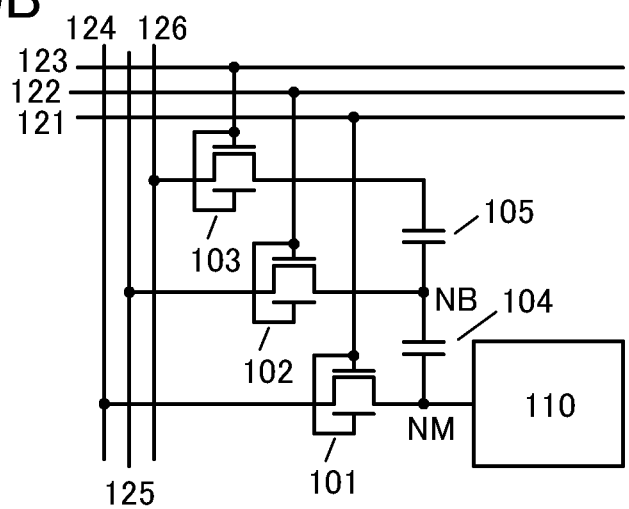
Figure 9C:
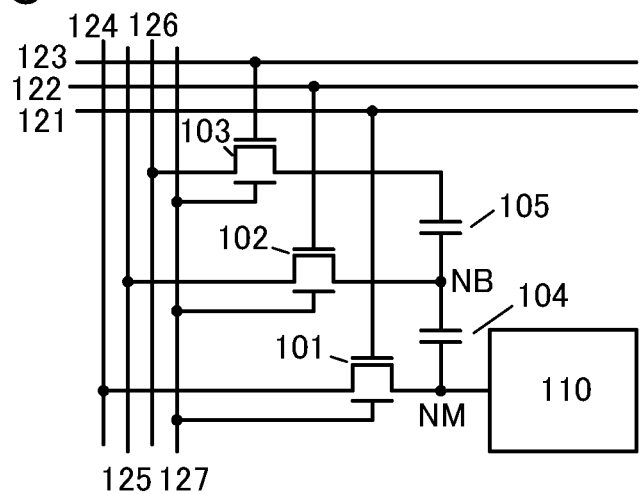

In addition, as illustrated in FIGS. 9(B) and 9(C), a structure may be employed in which the transistors 101, 102, and 103 each include a back gate. FIG. 9(B) illustrates a structure in which the back gates are electrically connected to front gates, which has an effect of increasing on-state current. FIG. 9(C) illustrates a structure in which the back gates are electrically connected to a wiring 134 capable of supplying a constant potential, so that the threshold voltage of the transistors can be controlled. Note that the structure illustrated in FIG. 9(B) and the structure illustrated in FIG. 9(C) may be combined as appropriate. Note that back gates may also be provided for the transistors included in the circuit block 110 illustrated in FIGS. 7(A) to 7(C) and FIGS. 8(A) to 8(C).

Next, the operation of correcting image data is described with reference to FIG. 10(A).

Figure 10A:
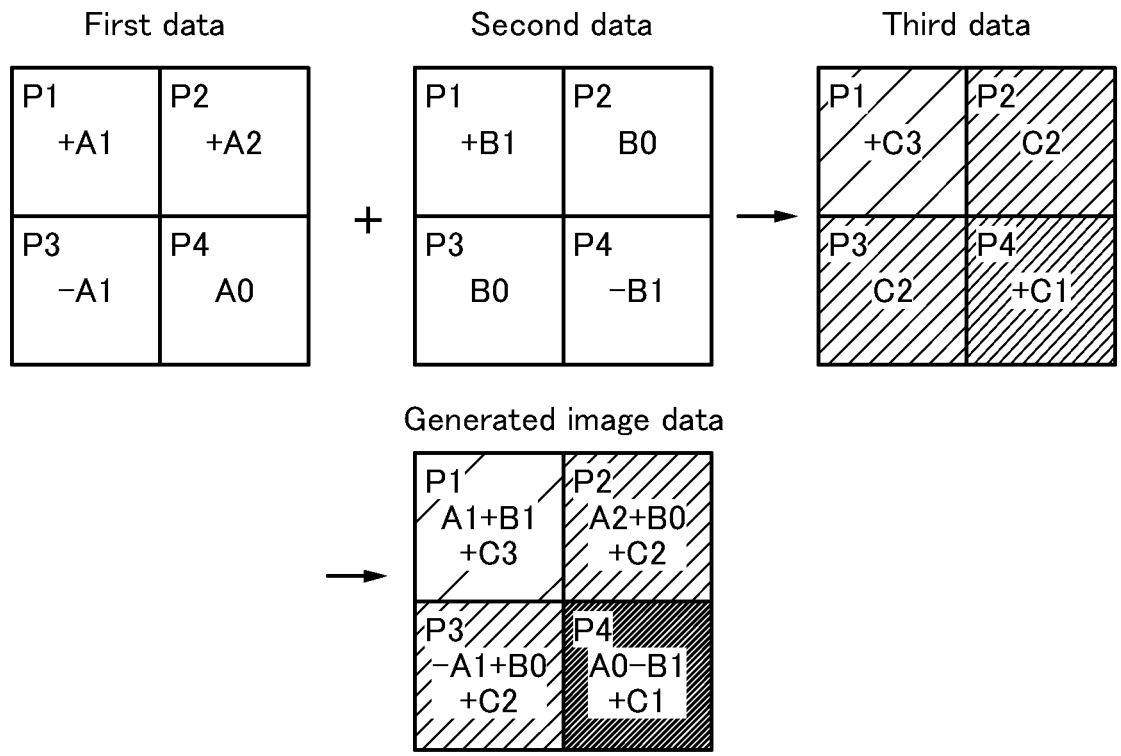
FIG. 10 Diagrams showing correction of image data and synthesis of images.

The diagram illustrated in FIG. 10(A) shows an example of the potential of data input to four pixels (P1 to P4) in the longitudinal and lateral directions: first data. (+A1, +A2, −A1, and A0), second data (+B1, B0, B0, and −B1), third data (+C3, C2, C2, and +C1), and the generated image data. The display element can perform display in accordance with the sum of the first to third data and can correct the original image.

For example, the first data and the second data can be data for correction. The third data can be the original image data.

Such a combination of the correction data and the image data enables, for example, upconversion, HDR display, correction of display unevenness unique to display devices, or correction of the threshold voltage of transistors included in pixels. Alternatively, these can be combined.

In an upconversion operation, the same image data is supplied to all the four pixels, for example. The pixels become capable of displaying different images by the correction. For example, image data for one certain pixel in a display device that includes pixels corresponding to 4K2K is input to four certain pixels in a display device that includes pixels corresponding to 8K4K, so that display with a higher resolution can be performed.

Alternatively, the luminance of a displayed image can be significantly improved when the same image data is used as the first data to the third data. This operation can supply a voltage higher than the maximum output value of a column driver to the pixel circuit, leading to not only higher image quality but also lower power consumption and lower production cost owing to the use of an inexpensive driver IC chip.

Figure 10B:
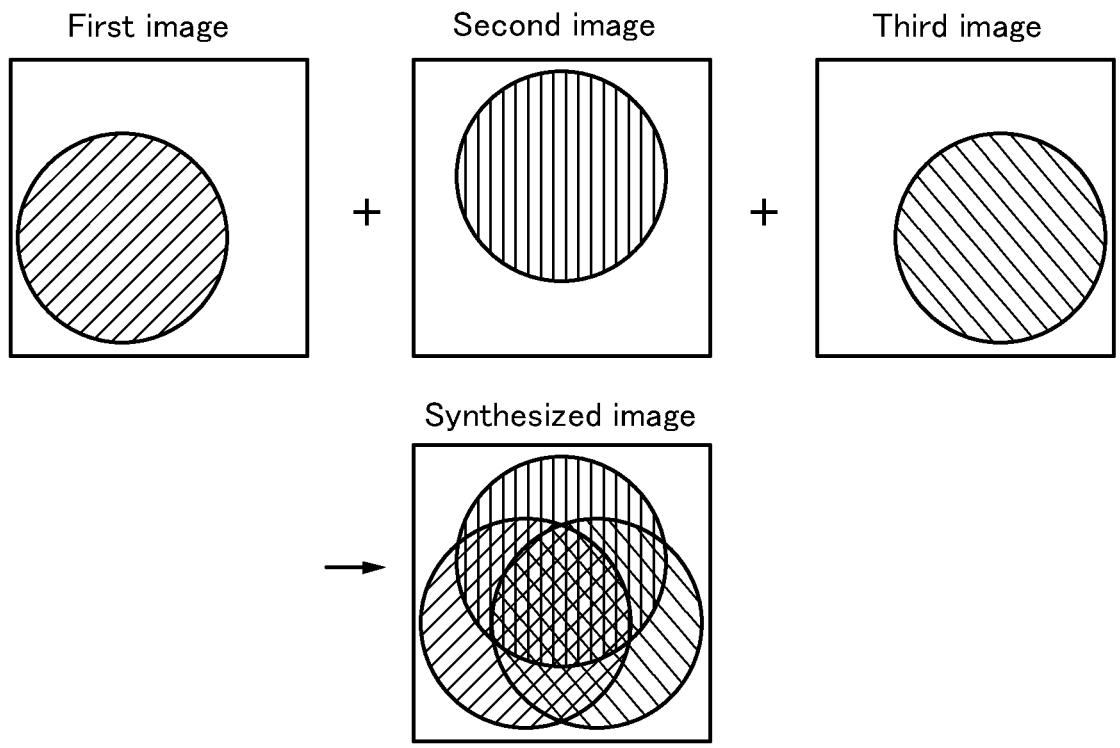

Different images superimposed on each other can be displayed, which is the correction of image data in a broad sense. FIG. 10(B) illustrates images of the entire display portion: a first image composed of the first data; a second image composed of the second data; a third image composed of the third data; and an image synthesized from the first image, the second image, and the third image.

For example, such a combination of different mage data can be applied to insertion of a character, display of AR (Augmented Reality), or the like.

The structures described for the pixel 10, the pixel 11, and the pixel 12, which is described above, can be arranged in a matrix as one component of a pixel, so that a pixel array can be formed. Alternatively, for another mode, sharing some of the transistors between pixels can add another function. Sharing a transistor can reduce the number of wirings, leading to a higher aperture ratio of the pixel, higher resolution, and lower power consumption owing to more efficient charge and discharge of the signal line and more efficient driver operation.

Figure 11:
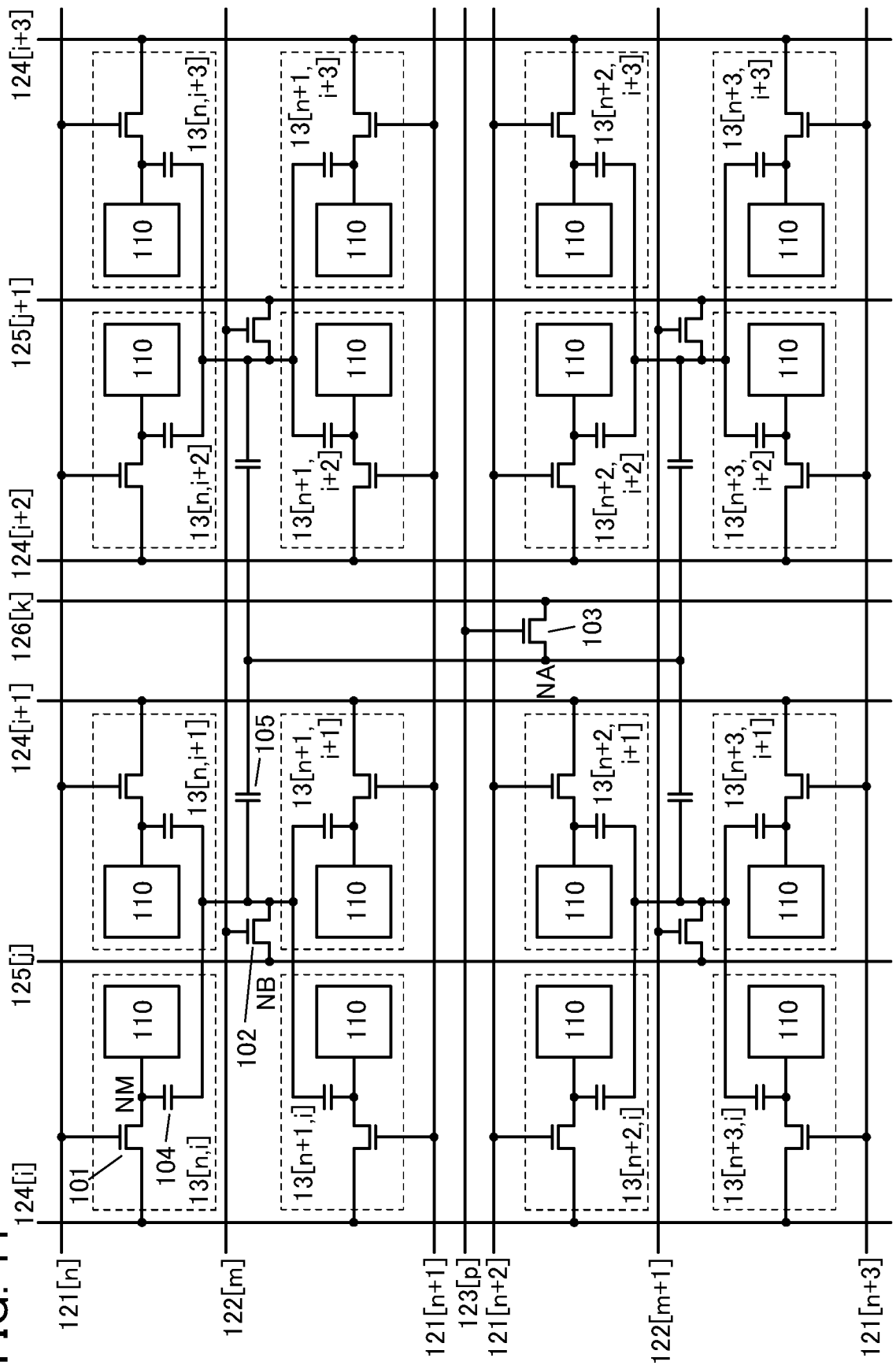
FIG. 11 A diagram illustrating a pixel array.

FIG. 11 illustrates part (corresponding to 16 pixels) of a pixel array including pixels 13, which employ the basic configuration of the pixel 10. The transistor 101, the capacitor 104, and the circuit block 110 are provided in one pixel 13. Note that in parentheses attached to reference numerals, n and m each denote a certain row and i, j, k each denote a certain column (n, m, i, j, and k are each a natural number).

The transistor 102 connected to four pixels 13 is provided in the pixel array. In addition, the capacitor 105 connected to four pixels 13 is provided. In addition, the transistor 103 connected to four capacitors 105 is provided.

On the assumption of a basic configuration of the pixel 10, the transistor 102 and the capacitor 105 are components of each pixel 13 and can be regarded as being shared by four pixels. Furthermore, the transistor 103 is a component of each pixel 13 and can be regarded as being shared by 16 pixels.

For some of the same operations, the number of required wirings and transistors can be smaller in this pixel array than in the configuration in which the pixels 10 are simply arranged in a matrix.

Even when the resolutions of the display device and the image data are different from each other, proper display can be performed by changing input paths of the image data and the correction data, not by upconversion or downconversion. Note that the operations can be basically performed in accordance with the timing charts shown in FIGS. 2(A) to 2(C) or FIGS. 3(A) to 3(C).

An example in which the number of pixels in the pixel array corresponds to 8K4K and image data with different resolutions are displayed is described below. Note that other pixel arrays to be described later can perform similar display operation.

First, the case where display is performed using image data with the 8K4K resolution is described. When display is performed using the image data with the 8K4K resolution, the image data is written as the first data to the node NM in each pixel through the transistor 101. At this time, when the second data is supplied through the transistor 102, the second data can be added to the node NM of the four pixels sharing the transistor 102. Furthermore, when the third data is supplied through the transistor 103, the third data can be added to the node NM of the 16 pixels sharing the transistor 103. That is, images can be corrected or superimposed on each other with the use of the second data and the third data.

Next, the case where display is performed using image data with the 4K2K resolution is described. When display is performed using the image data with the 4K2K resolution, the image data is written to the node NB in each pixel as the second data. Since the second data is supplied to four pixels, display can be performed without generation of new image data even in the pixel array with the 8K4K resolution.

At this time, when the first data is supplied to the node NM in each pixel through the transistor 101, each pixel can perform different displays. This operation enables, for example, upconversion from the 4K2K resolution to the 8K4K resolution. Furthermore, when the third data is supplied through the transistor 103, the third data can be added to the node NM of the 16 pixels sharing the transistor 103. That is, images can be corrected or superimposed on each other with the use of the first data and the third data.

Next, the case where display is performed using the image data with the Full-HD resolution. When display is performed using the image data with the Full-HD resolution, the image data is written to each pixel through the transistor 103 as the third data. Since the third data is supplied to 16 pixels, display can be performed without generation of new image data even in the pixel array with the 8K4K, resolution.

At this time, when the first data is supplied to the node NM in each pixel through the transistor 101, each pixel can perform different displays. This operation enables, for example, upconversion from the Full-HD resolution to the 8K4K resolution. Furthermore, when the second data is supplied through the transistor 102, the third data can be added to the node NM of the four pixels sharing the transistor 102. That is, images can be corrected or superimposed on each other with the use of the first data and the second data.

Figure 12:
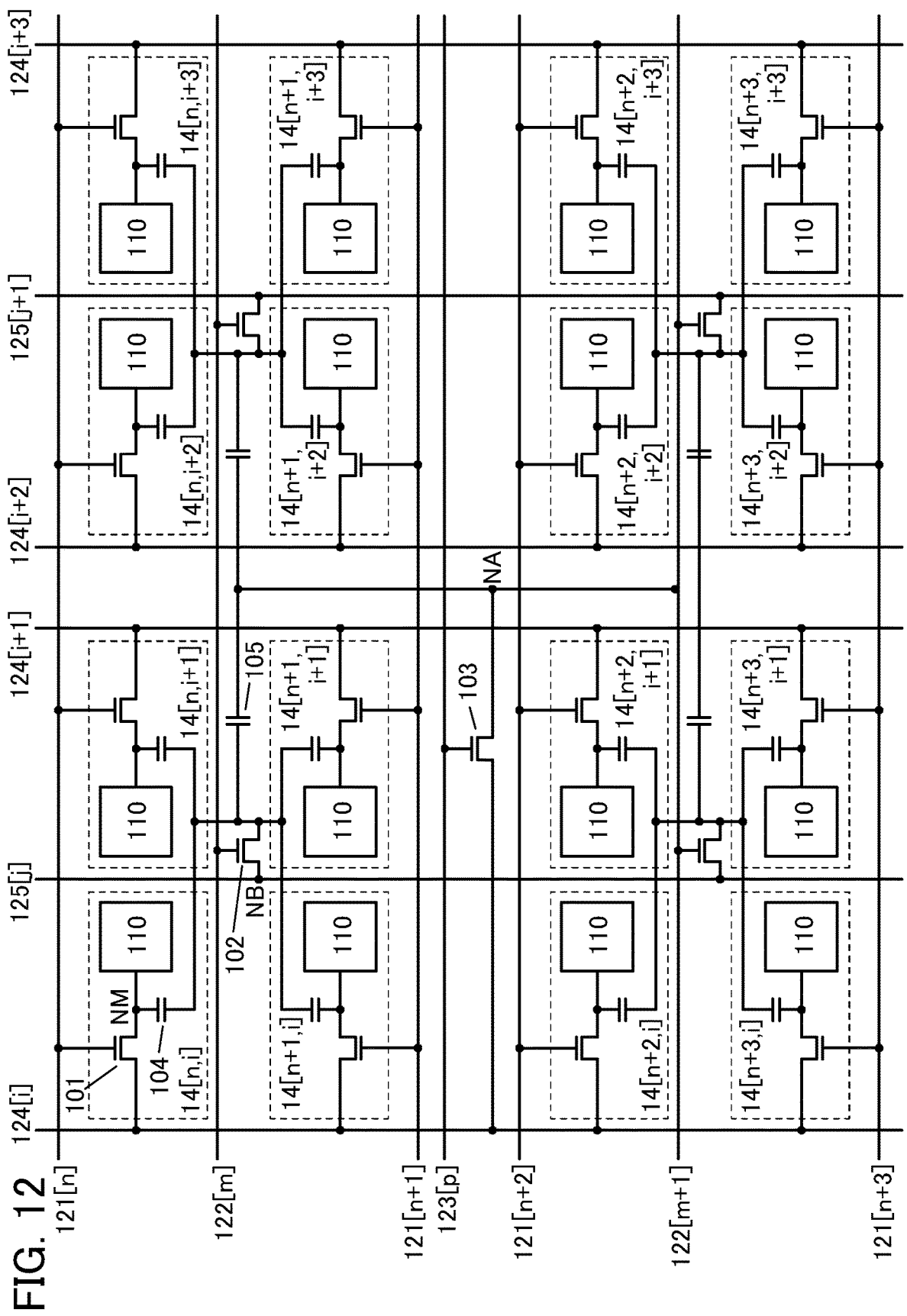
FIG. 12 A diagram illustrating a pixel array.

FIG. 12 illustrates part (corresponding to 16 pixels) of a pixel array including pixels 14, which employ the basic configuration of the pixel 11. The components are the same as those of the pixel array illustrated in FIG. 10 except that the wiring 126 is omitted and the other of the source and the drain of the transistor 103 is connected to the wiring 124. Note that the other of the source and the drain of the transistor 103 is connected to the wiring 124[i] in the example shown here, but may be connected to the wiring 124[i+1]. The pixel array illustrated in FIG. 12 can operate in accordance with the timing charts shown in FIGS. 4(B) to 4(D).

Figure 13:
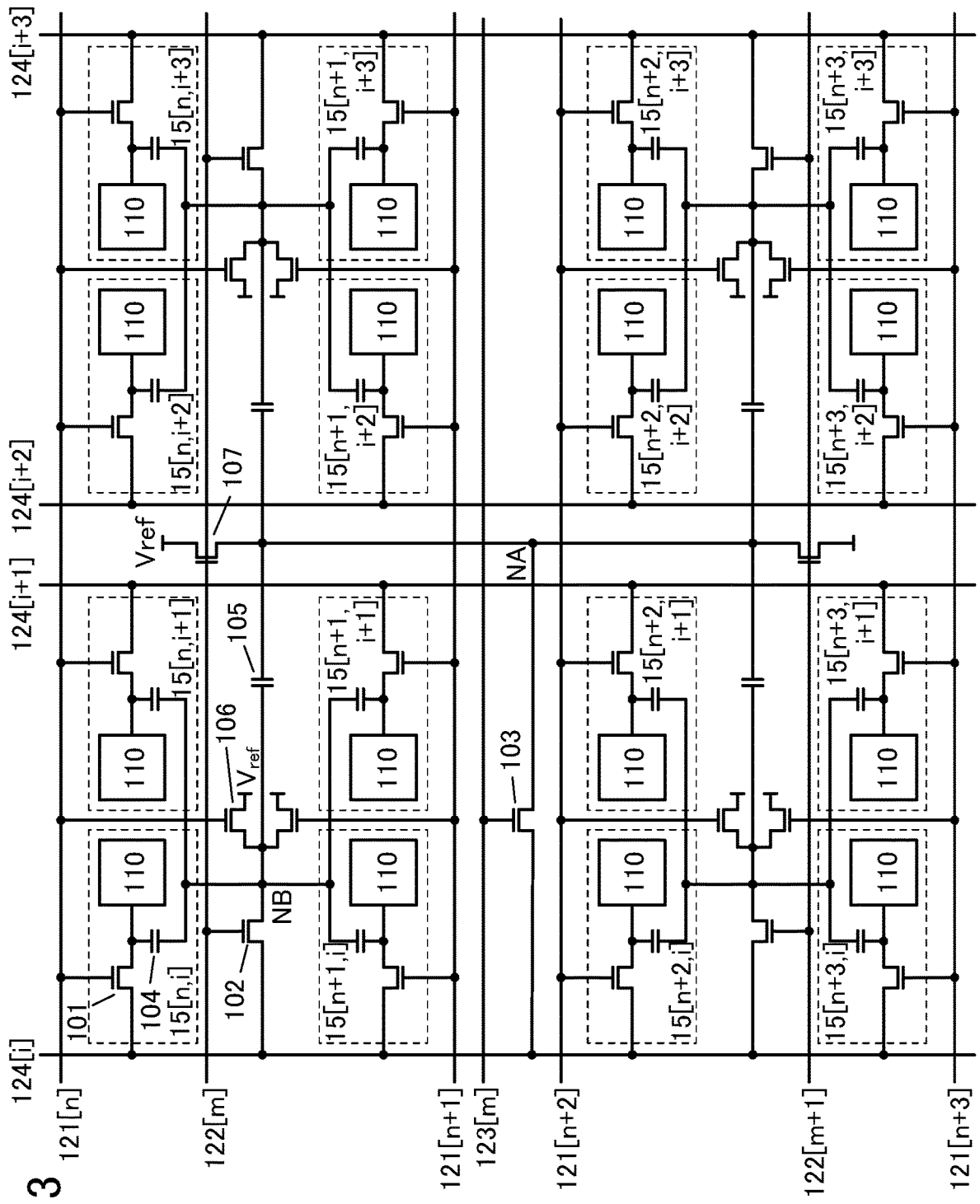
FIG. 13 A diagram illustrating a pixel array.

FIG. 13 illustrates part (corresponding to 16 pixels) of a pixel array including pixels 15, which employ the basic configuration of the pixel 12. As in the pixel 13 and the pixel 14, the transistor 101, the capacitor 104, and the circuit block 110 are provided in the pixel 15. Note that the other of the source and the drain of the transistor 103 is connected to the wiring 124[i] in the example shown here, but may be connected to the wiring 124[i+1]. The pixel array illustrated in FIG. 13 can operate in accordance with the timing charts shown in FIGS. 5(B) to 5(D).

The transistor 102 connected to four pixels 15 is provided in the pixel array. In addition, the transistor 106 connected to four pixels 15 is provided. In addition, the capacitor 105 connected to four pixels 15 is provided. In addition, the transistor 107 connected to four capacitors 105 is provided. In addition, the transistor 103 connected to four capacitors 105 is provided. Note that the electrical connection state is as described above, but the transistor 106 operates in accordance with the operation of two pixels 15 sharing a gate line.

On the assumption of basic configuration of the pixel 12, the transistor 102 and the capacitor 105 are components of each pixel 15 and can be regarded as being shared by four pixels. Furthermore, the transistor 106 is a component of each pixel 15, and can be regarded as being shared by two pixels. Furthermore, the transistor 107 is a component of each pixel 15, and can be regarded as being shared by eight pixels. Furthermore, the transistor 103 is a component of each pixel 15, and can be regarded as being shared by 16 pixels.

FIG. 14(A) is an example of a block diagram of a display device including the pixel array illustrated in FIG. 11. The display device includes a pixel array 19 where pixels 13 are arranged in a matrix, a row driver 31, a column driver 32, a circuit 33, and a selection circuit 34. In FIG. 14(A), the pixel 13 represents a component to which data can be input individually through the transistor 101, a pixel block 17 represents a group including four pixels to which the same data can be input through the transistor 102, and a pixel block 18 represents a group including 16 pixels to which the same data can be input through the transistor 103.

Note that the pixel array illustrated in FIG. 12 or FIG. 13 can be applied to the display device, although the number of wirings that connect the drivers and pixels is different from the above.

The row driver 31 can have a structure in which a shift register 20 and a buffer circuit 21 are combined, for example. When the conduction of the buffer circuit 21 is controlled, data can be selectively output to the wiring 121 or the wiring 122.

The column driver 32 can have a structure in which a shift register 22 and a buffer circuit 23 are combined, for example. When the conduction of the buffer circuit 23 is controlled, data can be selectively output to the wiring 123. Alternatively, a structure in which a selection circuit is further combined may be employed.

The circuit 33 has a function of generating correction data. Note that the circuit 33 can also be referred to as an external device for generating correction data. Here, the correction data is data generated on the basis of main image data, and corresponds to any of the above first to third data.

The row driver 31 is capable of controlling the conduction of the transistor 101, the transistor 102, and the transistor 103. The column driver 32 can supply the first to third data to the wirings 124, 125, and 126.

The first to third data can be input to the circuit 33. The circuit 33 generates correction data for upconversion or luminance correction in accordance with the main image data, and outputs the correction data as any of the first to third data.

In addition to the correction data generated in the circuit 33, the first to third data can be input to the selection circuit 34, and any of the data can be output to the column driver 32.

Note that the correction data can also be generated not only in the circuit 33 but also in the circuit 120 described above (see FIG. 14(B)). Alternatively, grayscale display may be performed in the display portion, and then the correction data may be generated on the basis of data obtained by measuring the luminance of the display with a luminance meter and data obtained by reading a photograph of the display. Alternatively, a sensor 24 capable of sensing the luminance of the display and a circuit 25 capable of generating the correction data by sensing deterioration of the display element may be provided (see FIG. 14(C)).

The circuit 33 and the circuit 25 may include a neural network. With the use of a deep neural network that has learned an enormous number of images as teacher data, for example, correction data with high accuracy can be generated.

Figure 15A:
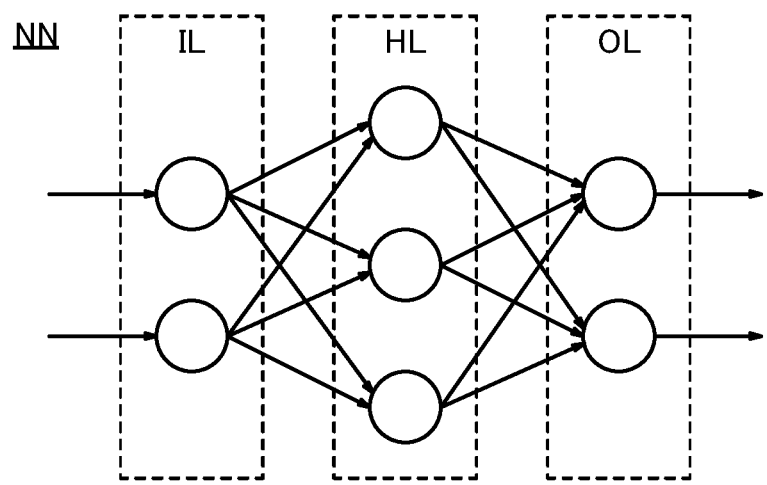
FIG. 15 Diagrams illustrating a configuration example of a neural network.

As illustrated in FIG. 15(A), a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network), and learning using a deep neural network can also be referred to as deep learning.

Input data are input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 15B:
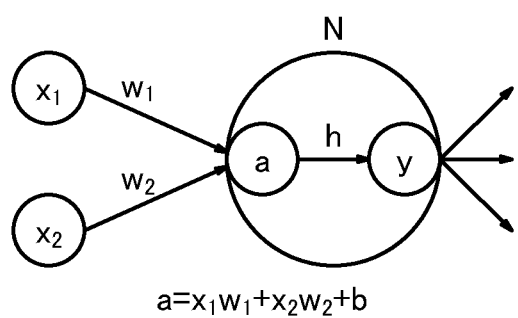

FIG. 15(B) illustrates an example of an operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal $y=h(a)$ is output from the neuron N.

In this manner, the operation with the neurons includes the operation that sums the products of the outputs and the weights of the neurons in the previous layer, that is, the product-sum operation ($x_1w_1+x_2w_2$ described above). This product-sum operation may be performed using a program on software or using hardware. In the case where the product-sum operation is performed by hardware, a product-sum operation circuit can be used. Either a digital circuit or an analog circuit can be used as this product-sum operation circuit.

The product-sum operation circuit may be formed using a Si transistor or may be formed using an OS transistor. An OS transistor is particularly preferably used as a transistor included in an analog memory of the product-sum operation circuit because of its extremely low off-state current. Note that the product-sum operation circuit may be formed using both a Si transistor and an OS transistor.

Figure 16:
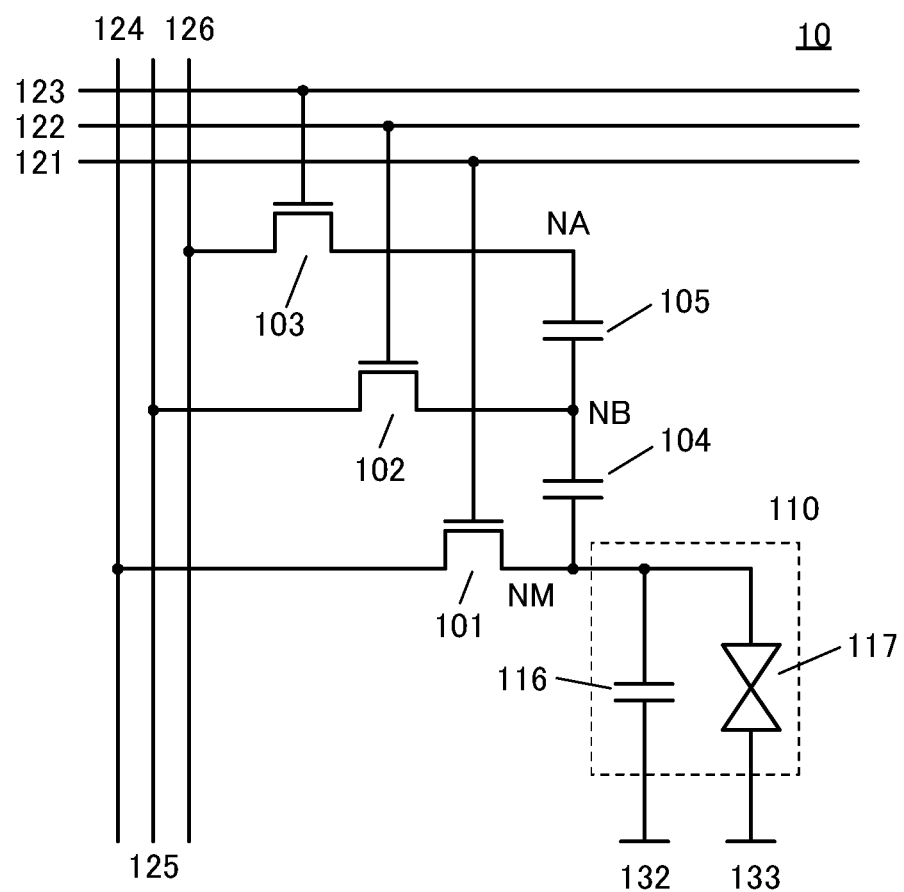
FIG. 16 A diagram illustrating a pixel circuit used for simulation.

Next, simulation results of a structure in which the circuit block illustrated in FIG. 8(A) is applied to the pixel 10 illustrated in FIG. 1 (see FIG. 16) are described. The parameters are as follows: the size of each transistor was L/W=4 μm/4 μm, the capacitance of the capacitor 104 was 500 fF, the capacitance of the capacitor 105 was 500 fF, the capacitance of the capacitor 116 was 100 fF, and the capacitance of the liquid crystal element 117 was 50 fF. The potentials of the wiring 132 and the wiring 133 were each set to 0 V, and the potential of the node NM at the time when the first data (D1) to the third data (D3) with the same voltage was written was estimated on the assumption that the source driver IC can output linearly from −5 V to +5 V. Note that SPICE was used as circuit simulation software.

Figure 17A:
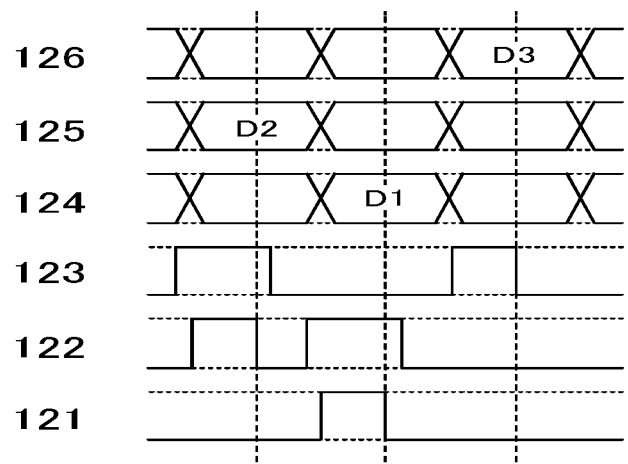
FIG. 17 Diagrams showing simulation results.

FIG. 17(A) is a timing chart used for the simulation, which follows the operations described with reference to FIGS. 3(A) to 3(C). The data were written in the order of the second data (172), the first data (D1), and the third data (D3), and the data with the same value were written.

Figure 17B:
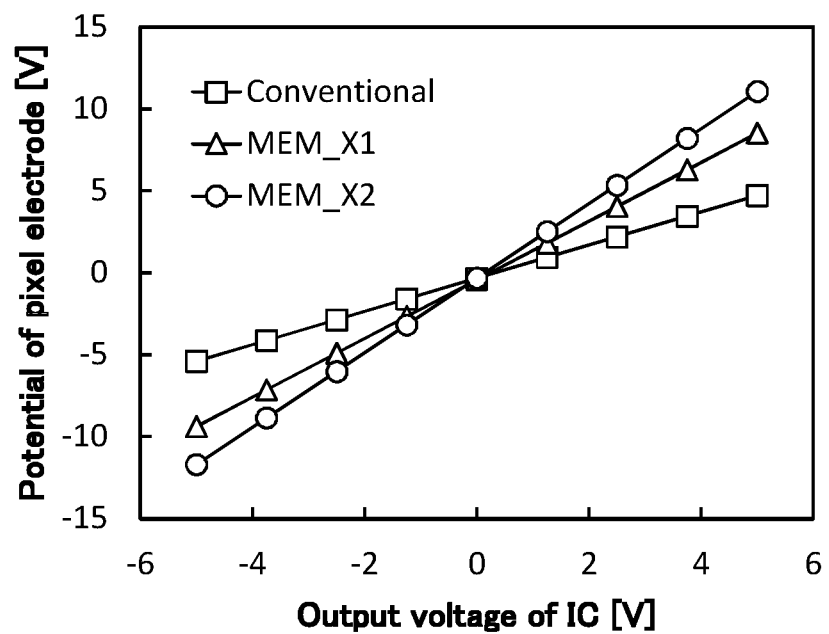

FIG. 17(B) shows the simulation results. Comparison is made among the followings: a structure (Conventional) in which the transistors 102 and 103 and the capacitors 104 and 105 are omitted and only the first data (D1) can be input; a structure (MEM_×1) in which the transistor 103 and the capacitor 105 are omitted and the first data (D1) and the second data (D2) can be input; and the structure (MEM_×2) of the present invention.

The simulation results confirm that the potential applied to the pixel electrode can be much higher than the output of the driver IC in the structure (MEM_×2) of the present invention. It is also confirmed that even a negative value can have a large absolute value. These are useful for inversion driving, the driving of a liquid crystal element that requires high voltage, and the like. Similarly, a potential can be applied to a gate of a driving transistor in an EL element.

This embodiment can be implemented in combination with any of the structures described in the other embodiments and the like, as appropriate.

Embodiment 2

In this embodiment, a structure example of a display device using a liquid crystal element and a structure example of a display device using an EL element are described. Note that the description of the components, operations, and functions of the display device described in Embodiment 1 is omitted in this embodiment.

Figure 18A:
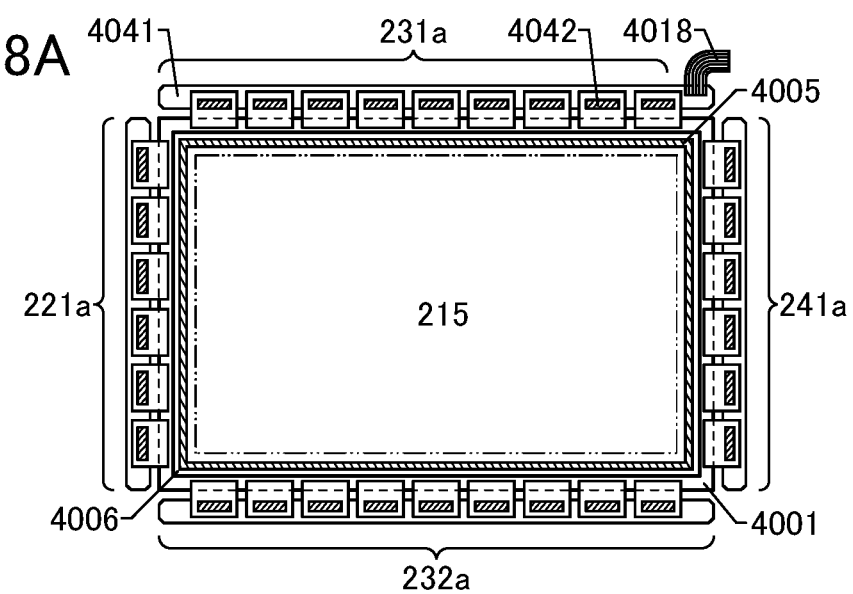
FIG. 18 Diagrams illustrating display devices.
Figure 18B:
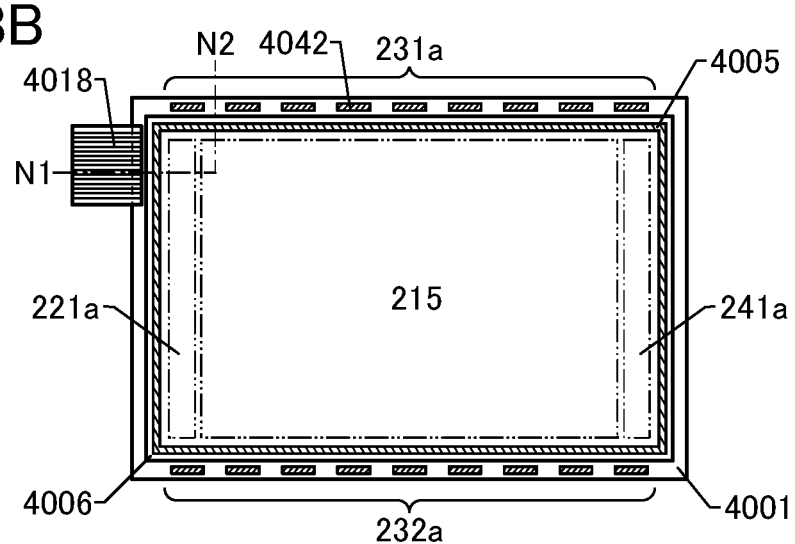
Figure 18C:
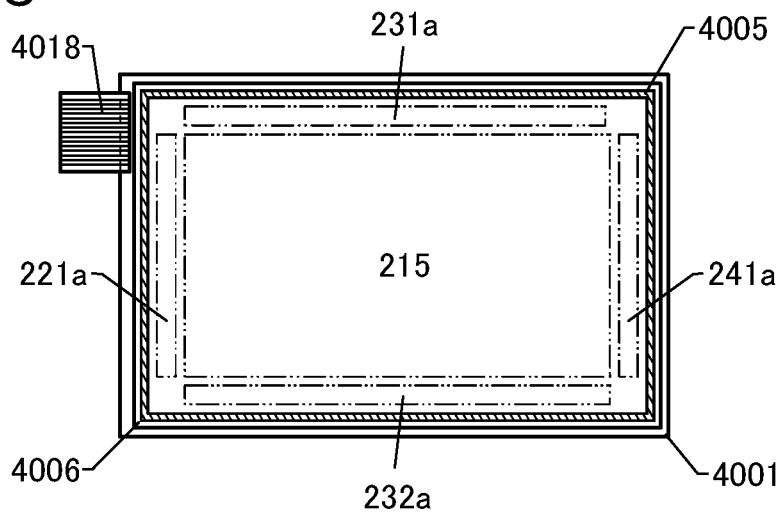

FIG. 18(A) to FIG. 18(C) are diagrams each illustrating a structure of a display device in which one embodiment of the present invention can be used.

In FIG. 18(A), a sealant 4005 is provided to surround a display portion 215 provided over a first substrate 4001, and the display portion 215 is sealed with the sealant 4005 and a second substrate 4006.

The pixel array including any of the pixels 10 to 15 and described in Embodiment 1 can be provided in the display portion 215. Note that a scan line driver circuit and a signal line driver circuit which are described below correspond to the row driver and the column driver, respectively.

In FIG. 18(A), a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The signal line driver circuit 231a and the signal line driver circuit 232a each have a function of the column driver described in Embodiment 1. The scan line driver circuit 221a has a function of the row driver described in Embodiment 1. The common line driver circuit 241a has a function of supplying a predetermined potential to the wirings 128, 129, 132, 133, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

FIG. 18(B) shows an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example shown in FIG. 18(B), the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 18(B), the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with display elements with the use of the first substrate 4001, the sealant 4005, and the second substrate 4006.

Although the signal line driver circuit 231a and the signal line driver circuit 232a are separately formed and mounted on the first substrate 4001 in the example shown in FIG. 18(9), one embodiment of the present invention is not limited to this structure. The scan line driver circuit may be separately formed and then mounted, or part of the signal line driver circuits or part of the scan line driver circuits may be separately formed and then mounted. The signal line driver circuit 231a and the signal line driver circuit 232a may be formed over the same substrate as the display portion 215, as shown in FIG. 18(C).

In some cases, the display device encompasses a panel in which the display element is sealed, and a module in which an IC or the like including a controller is mounted on the panel.

The display portion and the scan line driver circuit provided over the first substrate each include a plurality of transistors. As the transistors, the transistor described in the above embodiment can be used.

Transistors included in a peripheral driver circuit and transistors included in the pixel circuits of the display portion may have the same structure or different structures. The transistors included in the peripheral driver circuit may be transistors having the same structure, or transistors having two or more kinds of structures may be included. Similarly, the transistors included in the pixel circuits may be transistors having the same structure, or transistors having two or more kinds of structures may be included.

An input device 4200 can be provided over the second substrate 4006. The display devices illustrated in FIGS. 18(A) to 18(C) and provided with the input device 4200 can function as a touch panel.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferred because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 19A:
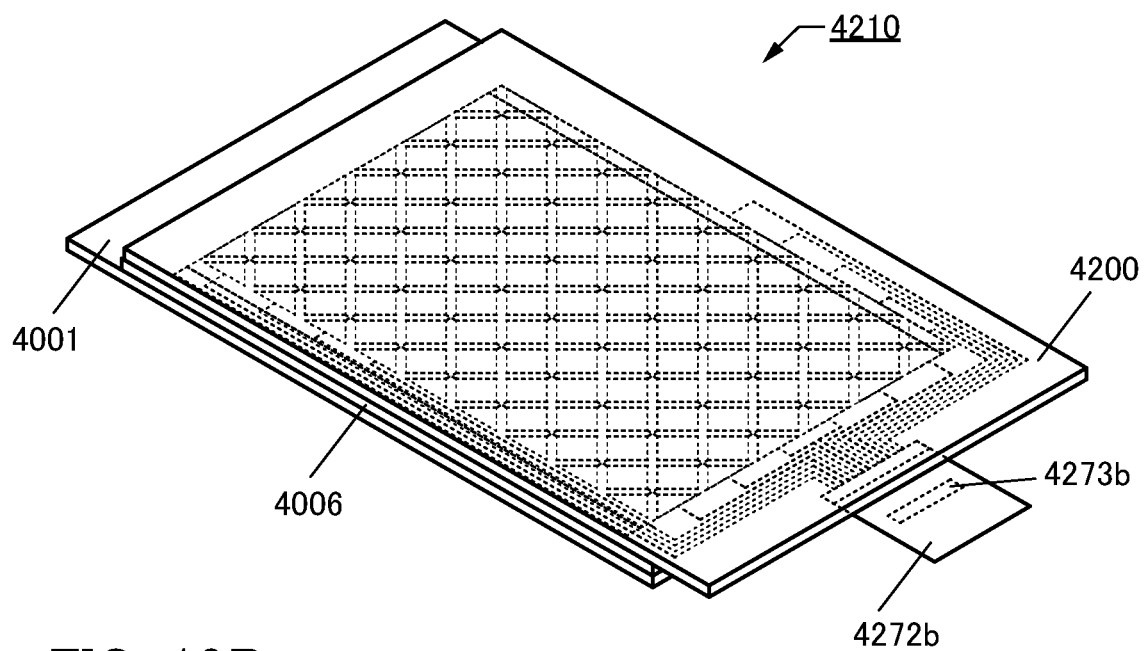
FIG. 19 Diagrams illustrating a touch panel.
Figure 19B:
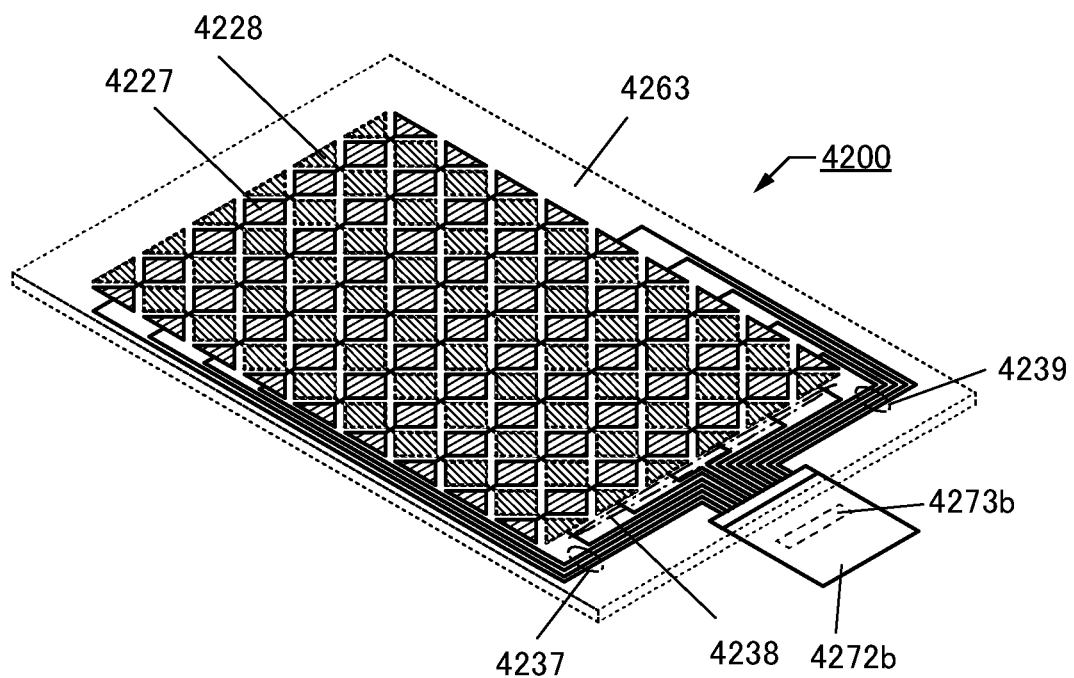

FIGS. 19(A) and 19(B) show an example of the touch panel. FIG. 19(A) is a perspective view of a touch panel 4210. FIG. 19(B) is a schematic perspective view of the input device 4200. Note that for clarity, only typical components are shown.

The touch panel 4210 has a structure in which a display device and a sensor element that are separately formed are attached to each other.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided for the FPC 4272b.

Alternatively, a touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

FIGS. 20(A) and 20(B) are cross-sectional views of a portion indicated by chain line N1-N2 in FIG. 18(B). Display devices shown in FIGS. 20(A) and 20(B) each include an electrode 4015, and the electrode 4015 is electrically connected to a terminal included in the FPC 4018 through an anisotropic conductive layer 4019. In FIGS. 20(A) and 20(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors. In FIGS. 20(A) and 20(B), the transistor 4010 included in the display portion 215 and the transistor 4011 included in the scan line driver circuit 221a are shown as an example. In the examples shown in FIGS. 20(A) and 20(B), the transistor 4010 and the transistor 4011 are bottom-gate transistors but may be top-gate transistors.

In FIGS. 20(A) and 20(B), the insulating layer 4112 is provided over the transistor 4010 and the transistor 4011, In FIG. 20(B), a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display devices shown in FIGS. 20(A) and 20(B) each include a capacitor 4020. The capacitor 4020 includes an electrode 4021 formed in the same step as a gate electrode of the transistor 4010, and an electrode formed in the same step as the source electrode and the drain electrode. The electrodes overlap with each other with an insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor is set in consideration of the off state current of the transistors or the like.

The transistor 4010 provided in the display portion 215 is electrically connected to the display element. FIG. 20(A) shows an example of a liquid crystal display device using a liquid crystal element as the display element. In FIG. 20(A), a liquid crystal element 4013 serving as the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display device shown in FIG. 20(A), a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Examples of a material that can be used for the coloring layer include a metal material, a resin material, and a resin material containing a pigment or a dye. The light-blocking layer and the coloring layer can be formed by an inkjet method, for example.

The display devices shown in FIGS. 20(A) and 20(B) each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

As the display element included in the display device, a light-emitting element utilizing electroluminescence (EL element) can be used. An EL element includes a layer containing a light-emitting compound (also referred to as an "EL layer") between a pair of electrodes. A potential difference greater than the threshold voltage of the EL element is generated between the pair of electrodes, whereby holes are injected to the EL layer from the anode side and electrons are injected from the cathode side. The injected electrons and holes are recombined in the EL layer and the light-emitting compound contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined, the light-emitting organic compound forms an excited state, and light is emitted when the excited state returns to a ground state. Owing to such a mechanism, this light-emitting element is referred to as a current-excitation light-emitting element.

In addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method); a transfer method; a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions. Note that the description is made here using an organic EL element as the light-emitting element.

In order to extract light emitted from the light-emitting element, at least one of the pair of electrodes needs to be transparent. A transistor and a light-emitting element are formed over a substrate. The light-emitting element can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting element having any of the emission structures can be used.

FIG. 20(B) shows an example of a light-emitting display device using a light-emitting element as a display element (also referred to as an "EL display device"). A light-emitting element 4513 serving as the display element is electrically connected to the transistor 4010 provided in the display portion 215. The structure of the light-emitting element 4513 is a stacked-layer structure of the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The partition wall 4510 is formed using an organic insulating material or an inorganic insulating material. It is particularly preferable that the partition wall 4510 be formed using a photosensitive resin material to have an opening portion over the first electrode layer 4030 such that a side surface of the opening portion slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material for the light-emitting layer 4511.

As a color display method, there are a method in which the light-emitting element 4513 that emits white light is combined with a coloring layer and a method in which the light-emitting element 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting element 4513 has a microcavity structure.

The light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic-based resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 21:
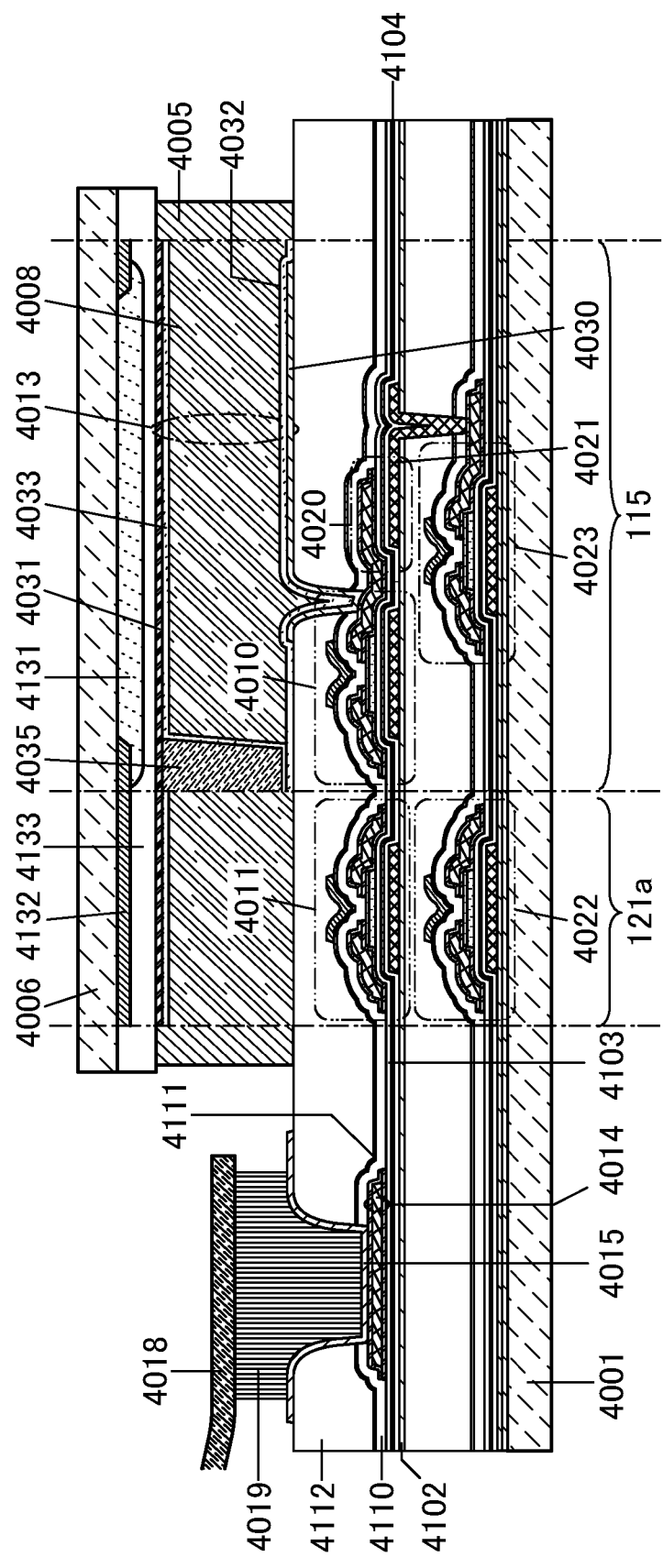
FIG. 21 A diagram illustrating a display device.

Note that as illustrated in FIG. 21, a stacked structure including a region where a transistor and a capacitor overlap with each other in the height direction may be employed. For example, when the transistor 4011 and a transistor 4022 included in the driver circuit are provided to overlap with each other, a display device with a narrow bezel can be provided. Furthermore, when the transistor 4010, a transistor 4023, the capacitor 4020, and the like included in the pixel circuit are provided to at least partly overlap with each other, the aperture ratio and the resolution can be improved. Although an example in which the stacked structure is employed for the liquid crystal display device illustrated in FIG. 20(A) is illustrated in FIG. 21, the stacked structure may be employed for the EL display device illustrated in FIG. 20(B).

In addition, a light-transmitting conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

This embodiment can be implemented in combination with any of the structures described in the other embodiments and the like, as appropriate.

Embodiment 3

In this embodiment, examples of transistors which can be used as the transistors described in the above embodiments are described with reference to drawings.

The display device of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

FIG. 22(A1) is a cross-sectional view of a channel-protective transistor 810, which is a type of bottom-gate transistor, in the channel length direction. In FIG. 22(A1), the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

The transistor 810 includes an insulating layer 741 over a channel formation region in the semiconductor layer 742. The transistor 810 also includes an electrode 744a and an electrode 744b which are over the insulating layer 726 and partly in contact with the semiconductor layer 742. The electrode 744a can function as one of a source electrode and a drain electrode. The electrode 744b can function as the other of the source electrode and the drain electrode. Part of the electrode 744a and part of the electrode 744h are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744h. According to one embodiment of the present invention, a transistor favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions (n$^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 shown in FIG. 22(A2) is different from the transistor 810 in that an electrode 723 that can function as a back gate electrode is provided over the insulating layer 729. The electrode 723 can be formed using a material and a method similar to those for the electro 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or an arbitrary potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. The electrode 723 may be provided between the insulating layer 728 and the insulating layer 729.

In the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 22(B1) is a cross-sectional view of a channel-protective transistor 820, which has a structure different from FIG. 22(A1), in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 741 that overlaps with the channel formation region can function as a channel protective layer.

A transistor 821 shown in FIG. 22(B2) is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

FIG. 22(C1) is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

A transistor 826 shown in FIG. 22(C2) is different from the transistor 825 in that the electrode 723 that can function as a back gate electrode is provided over the insulating layer 729.

FIGS. 23(A1) to 23(C2) are cross-sectional views of the transistors 810, 811, 820, 821, 825, and 826 in the channel width direction, respectively.

In each of the structures shown in FIGS. 23(B2) and FIG. 23(C2), the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 or the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 shown in FIG. 24(A1) is a type of top-gate transistor. The electrode 744*a* and the electrode 744*b* are electrically connected to the semiconductor layer 742 through opening portions formed in the insulating layer 728 and the insulating layer 729.

Part of the insulating layer 726 that does not overlap with the electrode 746 is removed, and an impurity 755 is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced not through the insulating layer 726. Thus, an LDD (Lightly Doped Drain) region is formed in the region of the semiconductor layer 742 that does not overlap with the electrode 746.

A transistor 843 shown in FIG. 24(A2) is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 shown in FIG. 24(B1) and a transistor 845 shown in FIG. 24(B2), the insulating layer 726 in a region that does not overlap with the electrode 746 may be completely removed. Alternatively, as in a transistor 846 shown in FIG. 24(C1) and a transistor 847 shown in FIG. 24(C2), the insulating layer 726 may be left.

Also in the transistor 842 to the transistor 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIGS. 25(A1) to 25(C2) are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the structures described in the other embodiments and the like, as appropriate.

Embodiment 4

Examples of an electronic device that can use the display device of one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 26 show specific examples of such electronic devices.

Figure 26A:
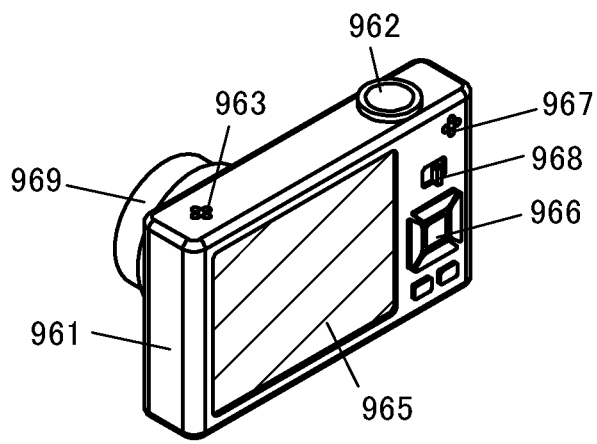
FIG. 26 Diagrams each illustrating an electronic device.

FIG. 26(A) shows a digital camera, which includes a housing 961, a shutter button 962, a microphone 963, a speaker 967, a display portion 965, operation keys 966, a zoom lever 968, a lens 969, and the like. The use of the display device of one embodiment of the present invention for the display portion 965 enables display of a variety of images.

Figure 26B:
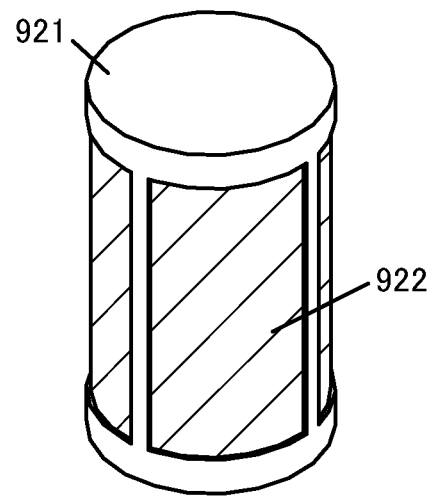

FIG. 26(B) shows a digital signage, which has large display portions 922. The digital signage can be installed on the side surface of a pillar 921, for example. The use of the display device of one embodiment of the present invention for the display portion 922 enables display with high quality.

Figure 26C:
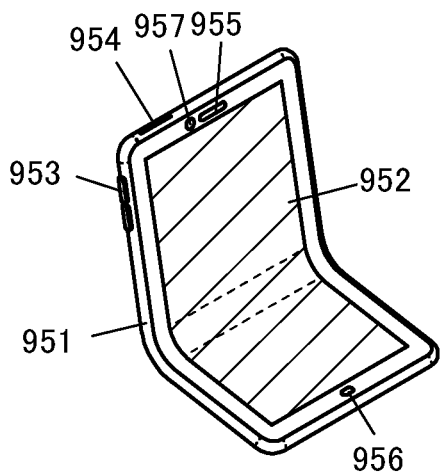

FIG. 26(C) shows a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a linger, a stylus, or the like. The housing 951 and the display portion 952 have flexibility and can be used in a bent state as shown in the figure. The use of the display device of one embodiment of the present invention for the display portion 952 enables display of a variety of images.

Figure 26D:
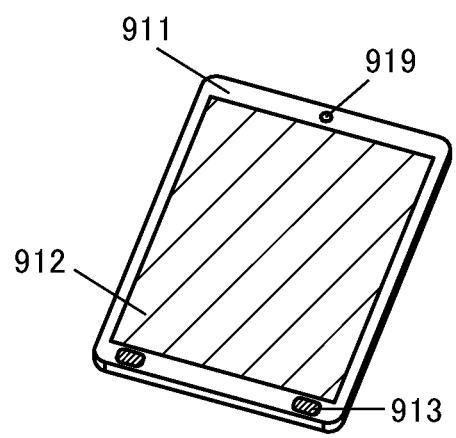

FIG. 26(D) shows a portable data terminal, which includes a housing 911, a display portion 912, speakers 913, a camera 919, and the like. A touch panel function of the display portion 912 enables input and output of information. The use of the display device of one embodiment of the present invention for the display portion 912 enables display of a variety of images.

Figure 26E:
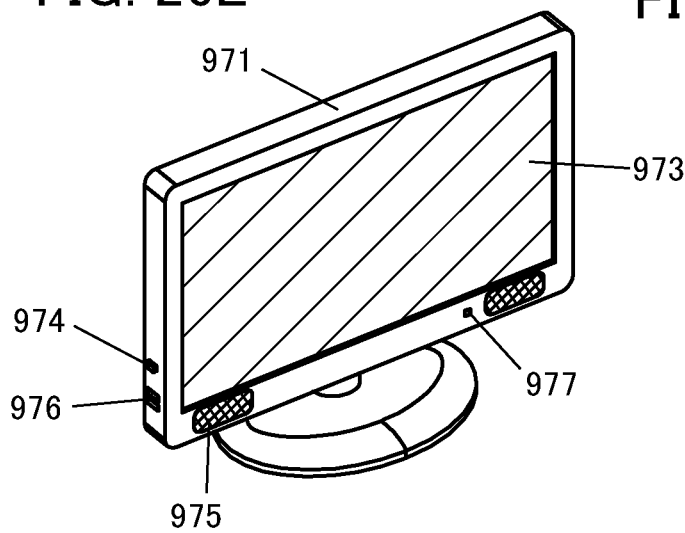

FIG. 26(E) shows a television, which includes a housing 971, a display portion 973, an operation key 974, speakers 975, a communication connection terminal 976, an optical sensor 977, and the like. The display portion 973 includes a touch sensor that enables input operation. The use of the display device of one embodiment of the present invention for the display portion 973 enables display of a variety of images.

Figure 26F:
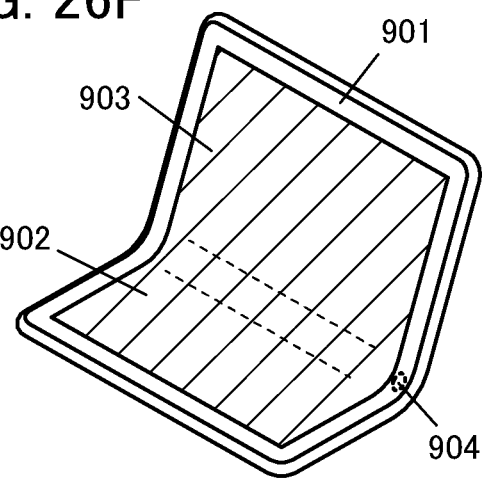

FIG. 26(F) shows an information processing terminal, which includes a housing 901, a display portion 902, a display portion 903, a sensor 904, and the like. The display portion 902 and the display portion 903 are formed using one display panel and flexible. The housing 901 is also flexible, can be used in a bent state as shown in the figure, and can be used in a flat plate shape like a tablet terminal. The sensor 904 can sense the shape of the housing 901, and it is possible to switch display on the display portion 902 and the display portion 903 when the housing is bent, for example. The use of the display device of one embodiment of the present invention for the display portion 902 and the display portion 903 enables display of a variety of images.

This embodiment can be implemented in combination with any of the structures described in the other embodiments and the like, as appropriate.

REFERENCE NUMERALS

10: pixel, 11: pixel, 12: pixel, 13: pixel, 14: pixel, 15: pixel, 17: pixel block, 18: pixel block, 19: pixel array, 20: shift register, 21: buffer circuit, 22: shift register, 23: buffer circuit, 24: sensor, 25: circuit, 31: row driver. 32: column driver. 33: circuit, 34: selection circuit, 101: transistor, 102: transistor, 103: transistor, 104: capacitor, 105: capacitor, 106: transistor, 107: transistor, 110: circuit block, 111: transistor, 112: transistor, 113: capacitor, 114: EL element, 115: transistor, 116: capacitor, 117: liquid crystal element, 118: transistor, 119: transistor, 120: circuit, 121: wiring, 122: wiring, 123: wiring, 124: wiring, 125: wiring, 126: wiring, 127: wiring, 128: wiring, 129: wiring, 130: wiring, 131: wiring, 132: wiring, 133: wiring, 134: wiring, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: housing, 902: display portion, 903: display portion, 904: sensor, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: control key, 967: speaker, 968: zoom lever, 969: lens, 971: housing, 973: display portion, 974: control key, 975: speaker, 976: communication connection terminal, 977: optical sensor, 4001: substrate, 4005: sealant, 4006: substrate, 4008: liquid crystal layer, 4010: transistor, 4011: transistor, 4013: liquid crystal element, 4014: wiring, 4015: electrode, 4017: electrode, 4018: FPC, 4019: anisotropic conductive layer, 4020: capacitor, 4021: electrode, 4022: transistor, 4023: transistor, 4030: electrode layer, 4031: electrode layer, 4032: insulating layer. 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: partition, 4511: light-emitting layer, 4513: light-emitting element, 4514: filler

The invention claimed is:
1. A display device comprising:
a first transistor;
a second transistor;
a third transistor;
a fourth transistor;
a fifth transistor;
a first capacitor;
a first wiring;
a second wiring;
a third wiring;
a second capacitor; and
a circuit block,
wherein one of a source and a drain of the first transistor is electrically connected to one electrode of the first capacitor,
wherein the one electrode of the first capacitor is electrically connected to the circuit block,
wherein the other electrode of the first capacitor is electrically connected to one of a source and a drain of the second transistor,
wherein the one of the source and the drain of the second transistor is electrically connected to one electrode of the second capacitor,
wherein the other electrode of the second capacitor is electrically connected to one of a source and a drain of the third transistor,
wherein the circuit block comprises a display element,
wherein the other of the source and the drain of the first transistor is electrically connected to the first wiring,
wherein the other of the source and the drain of the third transistor is electrically connected to the first wiring,
wherein one of a source and a drain of the fourth transistor is electrically connected to the one electrode of the second capacitor,
wherein one of a source and a drain of the fifth transistor is electrically connected to the other electrode of the second capacitor,
wherein the other of the source and the drain of the second transistor is electrically connected to the first wiring,
wherein a gate of the first transistor is electrically connected to the second wiring,
wherein a gate of the fourth transistor is electrically connected to the second wiring,
wherein a gate of the second transistor is electrically connected to the third wiring, and
wherein a gate of the fifth transistor is electrically connected to the third wiring.

2. A display device comprising:
a first circuit;
a second circuit;
a second transistor;
a third transistor; and
a second capacitor,
wherein the first circuit and the second circuit each comprise a first transistor, a first capacitor, and a circuit block,
wherein one of a source and a drain of the first transistor is electrically connected to one electrode of the first capacitor,
wherein the one electrode of the first capacitor is electrically connected to the circuit block,
wherein the other electrode of the first capacitor is electrically connected to one of a source and a drain of the second transistor,
wherein the one of the source and the drain of the second transistor is electrically connected to one electrode of the second capacitor,
wherein the other electrode of the second capacitor is electrically connected to one of a source and a drain of the third transistor, and
wherein the circuit block comprises a display element.

3. The display device according to claim 2, further comprising a first wiring,
wherein the other of the source and the drain of the first transistor included in the first circuit is electrically connected to the first wiring, and
wherein the other of the source and the drain of the third transistor is electrically connected to the first wiring.

4. The display device according to claim 3, further comprising:
a fourth transistor;
a fifth transistor;
a second wiring; and
a third wiring,
wherein one of a source and a drain of the fourth transistor is electrically connected to the one electrode of the second capacitor,
wherein one of a source and a drain of the fifth transistor is electrically connected to the other electrode of the second capacitor,
wherein the other of the source and the drain of the second transistor is electrically connected to the first wiring,
wherein a gate of the first transistor included in the first circuit is electrically connected to the second wiring,
wherein a gate of the first transistor included in the second circuit is electrically connected to the second wiring,
wherein a gate of the fourth transistor is electrically connected to the second wiring,
wherein a gate of the second transistor is electrically connected to the third wiring, and
wherein a gate of the fifth transistor is electrically connected to the third wiring.

5. The display device according to claim 1,
wherein the circuit block comprises a sixth transistor, a seventh transistor, a third capacitor, and an EL element as the display element,
wherein one electrode of the EL element is electrically connected to one of a source and a drain of the seventh transistor,
wherein the other of the source and the drain of the seventh transistor is electrically connected to one electrode of the third capacitor,
wherein one electrode of the third capacitor is electrically connected to one of a source and a drain of the sixth transistor,
wherein a gate of the sixth transistor is electrically connected to the other electrode of the third capacitor, and
wherein the other electrode of the third capacitor is electrically connected to the one electrode of the first capacitor.

6. The display device according to claim 1,
wherein the circuit block comprises a fourth capacitor and a liquid crystal element as the display element,
wherein one electrode of the liquid crystal element is electrically connected to one electrode of the fourth capacitor, and
wherein the one electrode of the fourth capacitor is electrically connected to the one electrode of the first capacitor.

7. The display device according to claim 6, further comprising an eighth transistor,
wherein the one electrode of the fourth capacitor is electrically connected to one of a source and a drain of the eighth transistor, and
wherein the other of the source and the drain of the eighth transistor is electrically connected to the one electrode of the first capacitor.

8. The display device according to claim 1,
wherein the first transistor comprises a metal oxide in a channel formation region,
wherein the metal oxide comprises In, Zn, and M, and
wherein M is Al, Ti, Ga, Sn, Y, Zr, La, Ce, Nd, or Hf.

9. The display device according to claim 2,
wherein the circuit block comprises a sixth transistor, a seventh transistor, a third capacitor, and an EL element as the display element,
wherein one electrode of the EL element is electrically connected to one of a source and a drain of the seventh transistor,
wherein the other of the source and the drain of the seventh transistor is electrically connected to one electrode of the third capacitor,
wherein one electrode of the third capacitor is electrically connected to one of a source and a drain of the sixth transistor,
wherein a gate of the sixth transistor is electrically connected to the other electrode of the third capacitor, and
wherein the other electrode of the third capacitor is electrically connected to the one electrode of the first capacitor.

10. The display device according to claim 9,
wherein the circuit block comprises a fourth capacitor and a liquid crystal element as the display element,
wherein one electrode of the liquid crystal element is electrically connected to one electrode of the fourth capacitor, and
wherein the one electrode of the fourth capacitor is electrically connected to the one electrode of the first capacitor.

11. The display device according to claim 10, further comprising an eighth transistor,
wherein the one electrode of the fourth capacitor is electrically connected to one of a source and a drain of the eighth transistor, and
wherein the other of the source and the drain of the eighth transistor is electrically connected to the one electrode of the first capacitor.

12. The display device according to claim 2,
wherein the first transistor comprises a metal oxide in a channel formation region,
wherein the metal oxide comprises In, Zn, and M, and
wherein M is Al, Ti, Ga, Sn, Y, Zr, La, Ce, Nd, or Hf.

13. An electronic device comprising:
the display device according to claim 1; and
a camera.

14. An electronic device comprising:
the display device according to claim 2; and
a camera.

* * * * *